United States Patent [19]

Shinohara et al.

[11] Patent Number: 5,891,264
[45] Date of Patent: *Apr. 6, 1999

[54] SOLAR CELL AND METHOD FOR PRODUCING ELECTRODE FOR SOLAR CELL

[75] Inventors: Hisato Shinohara; Hisao Morooka; Izumi Ikeo, all of Yamanashi; Akemi Takenouchi, Kanagawa; Setsuo Nakajima, Kanagawa; Yasuyuki Arai, Kanagawa, all of Japan

[73] Assignee: Semiconductor Energy Laboratory Co., Ltd., Kanagawa-ken, Japan

[*] Notice: The term of this patent shall not extend beyond the expiration date of Pat. No. 5,772,504.

[21] Appl. No.: 956,593

[22] Filed: Oct. 23, 1997

Related U.S. Application Data

[62] Division of Ser. No. 579,481, Dec. 27, 1995, Pat. No. 5,711,824.

[30] Foreign Application Priority Data

| Jan. 9, 1995 | [JP] | Japan | 7-017549 |
| Jun. 19, 1995 | [JP] | Japan | 7-176731 |
| Sep. 5, 1995 | [JP] | Japan | 7-252004 |

[51] Int. Cl.$^6$ .................................................. H01L 31/04
[52] U.S. Cl. ........................... 136/261; 136/256; 136/259
[58] Field of Search .................................. 136/259, 256, 136/261

[56] References Cited

U.S. PATENT DOCUMENTS

| 5,101,260 | 3/1992 | Nath et al. | 257/53 |
| 5,486,238 | 1/1996 | Nakagawa et al. | 136/259 |
| 5,711,824 | 1/1998 | Shinohara et al. | 136/259 |

FOREIGN PATENT DOCUMENTS

| 60-257183 | 12/1985 | Japan | 136/259 |
| 62-203369 | 9/1987 | Japan . | |
| 6-061514 | 3/1994 | Japan . | |

OTHER PUBLICATIONS

Meeting on Japanese Applied Physics, Abstract No. 30A-G-12 (Mar. 30, 1995).

16th International Conference on Amorphous Semiconductors (ICAS), abstract No. Mo-Po4-2 (Sep. 3, 1995).

*Primary Examiner*—Mark Chapman
*Attorney, Agent, or Firm*—Sixbey, Friedman, Leedom & Ferguson, PC; Gerald J. Ferguson, Jr.; Eric J. Robinson

[57] ABSTRACT

An aluminum film is formed as a photoreflective electrode in the side opposite to the light incident side of a solar cell by sputtering at a substrate temperature of 50° to 200° C. using a target, aluminum containing silicon as an impurity element at 0.1 to 6.0 weight %. An aluminum film or a silver film into which an impurity element is not added is formed on the above aluminum film, to obtain a texture structure having convex and concave shapes. When an organic resin film substrate is used, components (released as a gas by heating and a vacuum atmosphere) such as water within the organic resin film is removed after the aluminum film is formed.

7 Claims, 19 Drawing Sheets

FIG.13A  FIG.13B
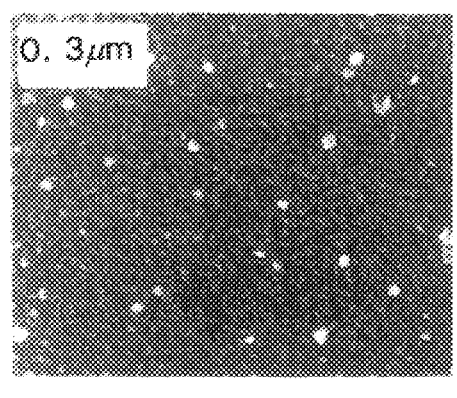
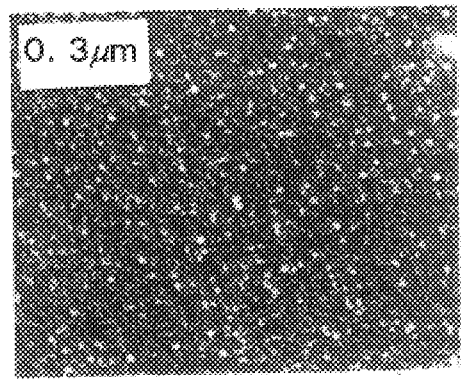
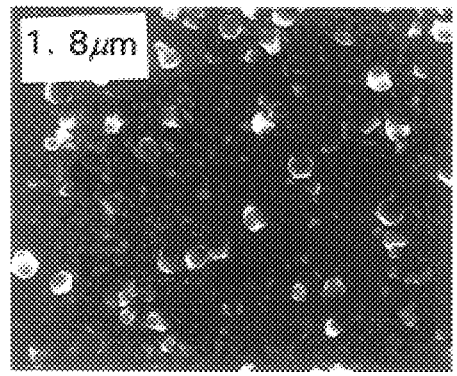
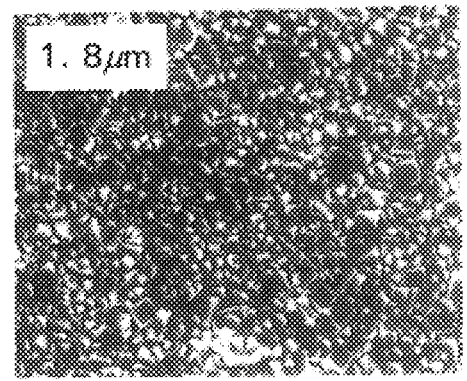
pure Al    Al - Si 0.5wt%
70 °C FIG.14A      FIG.14B
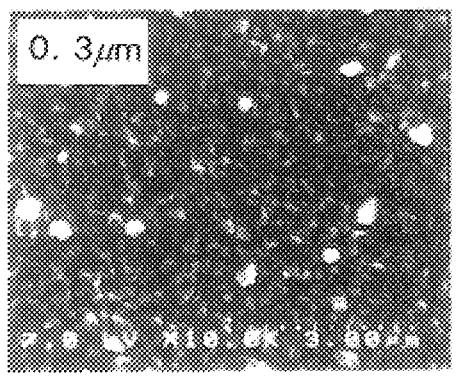
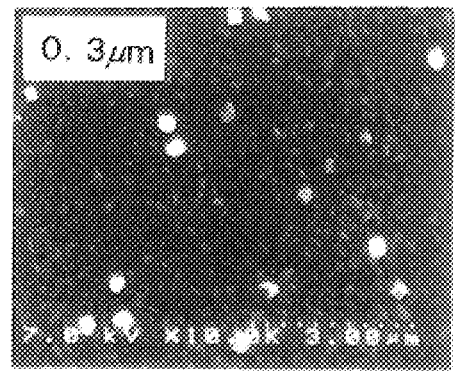
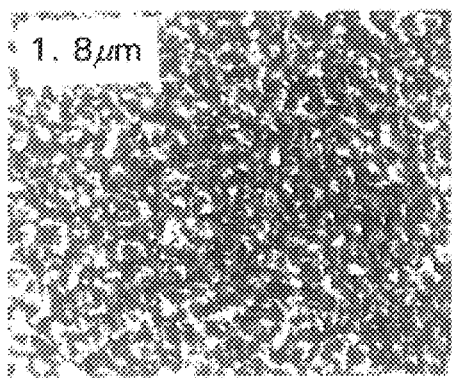
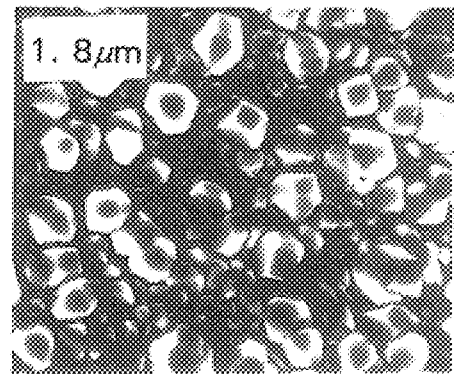
pure Al         Al - Si 0.5wt%
150 °C

|  | Conventional Solar Cell | Solar Cell of Embodiment | Difference (%) |
|---|---|---|---|
| Photoelectric Conversion Efficiency (%) | 7.5 | 8.1 | + 8 |
| Short Circuit Current (A) | 15.1 | 16.8 | + 11 |
| Open circuit voltage (V) | 0.84 | 0.83 | - 1 |
| Fill Factor | 0.584 | 0.583 | - 0.2 |

FIG.20

SOLAR CELL AND METHOD FOR PRODUCING ELECTRODE FOR SOLAR CELL

This is a Divisional application of Ser. No. 08/579,481, filed Dec. 27, 1995 now U.S. Pat. No. 5,711,824.

BACKGROUND OF THE INVENTION

The present invention relates to a solar battery in which a photoelectric conversion layer for generating a photovoltage is formed by using an amorphous or microcrystalline silicon thin film. Also, the present invention relates to a photoreflective electrode of a solar cell having a texture structure. Further, the present invention relates to a photoreflective electrode of a solar cell using an organic resin film as a substrate.

A solar cell having a photoelectric conversion layer in which at least one PIN junction is formed using a amorphous or microcrystalline silicon film is utilized. In such the solar cell, a light which is incident on the solar cell and transmits without absorbing in a photoelectric conversion layer is reflected by a photoreflective electrode provided in a light incident side position and an opposite side position, and then is incident on the photoelectric conversion layer again, so that a light absorption in the photoelectric conversion layer is promoted by the photoreflective electrode.

The photoreflective electrode is formed by a single layer film (aluminum (Al) or silver (Ag)), a laminate layer of a transparent conductive film (such as indium tin oxide (ITO) alloy, zinc oxide (ZnO), and tin oxide (SnO2)) or a metal film (such as titanium (Ti), chromium (Cr), nickel (Ni), and stainless steel) and aluminum or silver.

A photoreflective electrode has an uneven surface (so called the texture structure) formed by aligning crystals of a metal used as its material at a desired direction. A light which is incident on a photoelectric conversion layer and reaches the photoreflective electrode without absorbing in the photoelectric conversion layer is scattered and reflected at various directions, so that the light is incident on the photoelectric conversion layer. By this, the improvement of light absorbing efficiency is attempted.

When an aluminum film is used as an photoreflective electrode, the aluminum film having the purity of 99.99% is formed on a glass substrate or an organic resin film substrate by sputtering in a conventional case. However, only an aluminum film having almost an even surface can be obtained by this method.

In an uneven aluminum film, since an integral reflection (total amount of total reflection light) includes almost mirror (directional) reflection (a reflection angle of reflection light is the same angle as an incident angle of an incident light), it cannot be expected to utilize a light effectively. Particularly, the long wavelength component of an incident light cannot be utilized sufficiently.

It is attempted to obtain a texture structure by crystal growth of the aluminum film along a desired direction. When aluminum is used as a photoreflective electrode and the aluminum film is formed by sputtering while heating a substrate, crystallization of aluminum is promoted and crystal grains are generated to obtain a surface having an uneven shape. However, since a size and a shape of the generated crystal grains is large or nonuniform for a photoreflective electrode of a solar cell, it is not effective to improve a photoelectric conversion efficiency. Also, a film quality is nonuniform.

In the formed aluminum film, large and abnormal crystal grains having a diameter of about 1 μm may be grown. By generation of the crystal grains, a short circuit may be caused between an upper electrode (light incident side electrode) and a photoreflective electrode. FIG. 5 shows a SEM photograph representing a state that large and abnormal crystal grains are generated in an aluminum film formed by a conventional method.

When an aluminum film is formed on an organic resin film substrate by sputtering, since a film quality is reduced, fine film quality cannot be obtained and a photoreflectivity of a photoreflective electrode is decreased and an electric resistance is increased. As a result, a solar cell having high performance cannot be obtained.

SUMMARY OF THE INVENTION

To solve the above problems, an object of the present invention is to obtain a solar cell having high performance by increasing a photocurrent (a current produced by photovoltage) of a solar cell, obtaining a fine and uniform texture structure, and effectively utilizing a long wavelength component of an incident light, in an aluminum film constructing a photoreflective electrode of the solar cell formed on a flexible organic resin film substrate.

According to the present invention, there is provided a solar cell having a substrate, a photoreflective electrode, a photoelectric conversion layer, and a transparent electrode, wherein the photoreflective electrode includes an aluminum film containing at least one of silicon, nickel, and copper as an impurity element at 0.1 to 6.0%.

According to the present invention, there is provided a solar cell having a substrate, a photoreflective electrode, a photoelectric conversion layer, and a transparent electrode, wherein the photoreflective electrode includes a first aluminum film containing at least one of silicon, nickel, and copper as an impurity element at 0.1 to 6.0% and a second aluminum film formed on the first aluminum film and having substantially no impurity element.

According to the present invention, there is provided a solar cell having a substrate, a photoreflective electrode, a photoelectric conversion layer, and a transparent electrode, wherein the photoreflective electrode includes an aluminum film containing at least one of silicon, nickel, and copper as an impurity element at 0.1 to 6.0% and a silver film formed on the aluminum film and having substantially no impurity element.

According to the present invention, there is provided a solar cell having a substrate, a photoreflective electrode, a photoelectric conversion layer, and a transparent electrode, wherein the photoreflective electrode includes a first aluminum film containing at least one of silicon, nickel, and copper as an impurity element at 0.1 to 6.0% and a second aluminum film formed on the first aluminum film and having substantially no impurity element, wherein the first aluminum film has an average roughness of a surface thereof at 50 nm or more.

According to the present invention, there is provided a solar cell having a substrate, a photoreflective electrode, a photoelectric conversion layer, and a transparent electrode, wherein the photoreflective electrode includes an aluminum film containing at least one of silicon, nickel, and copper as an impurity element at 0.1 to 6.0% and a silver film formed on the aluminum film and having substantially no impurity element, and the aluminum film has an average roughness of a surface thereof at 50 nm or more.

In the solar cell, silicon is preferably used as an impurity element. Glass, metal, or an organic resin film may be used as a substrate. As a material of the organic resin film, polyethyleneterephthalate, polyethylenenaphthalate, polyestersulphone, polyimide, or aramid can be used.

According to the present invention, there is provided a method for producing an electrode for a solar cell having the step of forming an aluminum film on a substrate at a substrate temperature of 50° to 200° C. by sputtering using aluminum containing at least one of silicon, nickel, and copper at 0.1 to 6.0 weight % as a target.

According to the present invention, there is provided a method for producing an electrode for a solar cell having the steps of: forming a first aluminum film having an uneven surface on a substrate at a substrate temperature of 50° to 200° C. by sputtering using aluminum containing at least one of silicon, nickel, and copper at 0.1 to 6.0 weight % as a target; and forming one of a second aluminum film and a silver film on the first aluminum film, wherein the second aluminum film and the silver film have substantially no impurity element.

In the solar cell electrode producing method, silicon is preferably used as an impurity element. Glass, metal, or an organic resin film may be used as a substrate. As a material of the organic resin film, polyethyleneterephthalate, polyethylenenaphthalate, polyestersulphone, polyimide, or aramid can be used.

According to the present invention, there is provided a method for producing an electrode for a solar cell having the steps of: heating an organic resin film substrate to release a gas from the substrate; and forming an aluminum film on the substrate at a substrate temperature of 50° to 200° C. by sputtering after the heating step.

DC sputtering or RF sputtering can be used.

According to the present invention, there is provided a method for producing an electrode for a solar cell having the steps of: heating an organic resin film substrate to release a gas from the substrate; and forming an aluminum film on the substrate at a substrate temperature of 50° to 200° C. by sputtering using as a target, aluminum containing at least one of silicon, nickel, and copper as an impurity element at 0.1 to 6.0 weight %, after the heating step.

In the above method, silicon is preferably used as an impurity element.

The inventors have found that, by forming an aluminum film on the substrate at a substrate temperature of 50° to 200° C., preferably 70° to 150° C. by sputtering using as a target, aluminum containing, for example, silicon as an impurity element at 0.1 to 6.0 weight %, preferably 0.5 to 2.0 weight %, an aluminum film having an uneven surface suitable to a photoreflective electrode of a solar cell is obtained.

The content of an impurity element in the aluminum film is 0.1 to 6.0, preferably 0.1 to 2.0%, further preferably 0.1 to 1.0% (by Auger electron spectroscopy method). When the content of the impurity element in the aluminum film is 1.0% or less, since a diffusion reflectance (an integral reflectance—a mirror (directional) reflectance) of the aluminum film becomes high.

FIG. 12 shows a relationship between the content of silicon as an impurity element in the aluminum film and the diffusion reflectance (a wavelength of an incident light is 650 nm as a standard value) of an aluminum film, and a case wherein the content of silicon in an aluminum target is 0.5 weight %, 1.0 weight %, and 2.0 weight % and a substrate temperature is 150° C. in sputtering.

When the contents of an impurity element in a target are 0.5 weight %, 1.0 weight %, and 2.0 weight %, the contents of an impurity element in the formed aluminum film are 0.2 to 0.4% (typically 0.3%), 0.3 to 1.0% (typically 0.7%), and 0.6 to 1.5% (typically 1.0%), respectively.

Increasing of a film thickness of the aluminum film tends to enlarge crystal grains forming an uneven surface and to increase a diffusion reflectance. (See FIG. 16)

As an impurity element, silicon (Si) is preferred. When nickel (Ni), copper (Cu), or the like is used, the same effect is obtained. A preferable result is obtained by using DC sputtering and RF sputtering.

In the aluminum film, crystal grains having homogeneity is formed fine. An average size (diameter) of the crystal grains is several 100 to several 1000 Å. The crystal grains construct a convex portion of a texture structure in a photoreflective electrode of a solar cell, and a size and a shape thereof suitable to reflect an incident light (particularly, a long wavelength light) can be obtained.

Thus, according to the present invention, the aluminum film which has a fine texture structure and is superior as a photoreflective electrode of a solar cell can be formed. In the solar cell in which the aluminum film having the fine texture structure is used as a photoreflective electrode, a photocurrent can be increased and photoelectric conversion efficiency can be improved largely in comparison with a case wherein a conventional aluminum film having an even surface is used. Also, since abnormal and large growth of the crystal grains can be prevented, occurrence of a short circuit between a lower electrode and a transparent electrode of a solar cell can be prevented.

The number of convex and concave portions of a photoreflective electrode is increased as a film thickness of an aluminum film is increased, and thus a size (diameter) of grain (particle) of aluminum forming the convex and concave portions is enlarged. A conversion efficiency of a solar cell is increased by the convex and concave portions of a photoreflective electrode. However, if the convex and concave portions become large, an open circuit voltage or the like of a solar cell is reduced.

Influence of convex and concave shapes of the photoreflective electrode on a characteristic of a solar cell is explained using data shown in FIG. 8. FIG. 8 shows characteristics of a photocurrent (a short circuit current) and an open circuit voltage in a solar cell (AM1.5, 100 mW/cm$^2$) produced by using a photoreflective electrode in which an average roughness (measurement by JIS B0601 Rz (10 point average roughness)) of a surface is different. In FIG. 8, a short circuit current increases as convex and concave portions become large. This is because a light absorbed in a photoelectric conversion layer is increased by mainly a light limitation effect due to a texture structure.

An open circuit voltage is reduced from a point that a surface roughness (size of convex and concave portion) is about 30 nm. It is considered that the reduction of the open circuit voltage is caused by the nonuniformity of junction of a photoelectric conversion layer. The photoelectric conversion layer formed on the photoreflective electrode having an uneven surface (convex and concave portions) has a PIN junction structure. A P-type or an N-type layer which is formed thin has a surface roughness of 10 to 30 nm, and an I-type layer has a surface roughness of 300 to 500 nm. When a base film has convex and concave shapes, a film thickness of a photoelectric conversion layer formed on the base film is nonuniform by influence of the convex and concave shapes of the base film. If an average roughness of an uneven surface is equal to or larger than a thickness of a P-type or an N-type layer constructing the photoelectric conversion layer, since this influence cannot be ignore, the reduction of an open circuit voltage may be caused.

Thus, when the convex and concave portions of an aluminum film constructing a photoreflective electrode are made to be large, a photocurrent is increased by a light limitation effect. However, since an open circuit voltage is reduced, conversion efficiency cannot be improved sufficiently. In a certain case, conversion efficiency is further reduced by providing the convex and concave portions, so that an effect by a texture structure cannot be obtained.

For such a problem, in the present invention, an aluminum film or a silver film which contains substantially no impurity element (the content of an impurity element is less than 0.1% and the impurity element is not added intentionally) and used as a photoreflective electrode of a solar cell is formed on an aluminum film which has an uneven surface and contains silicon as an impurity element at 0.1 to 6.0 weight %, preferably 0.5 to 2.0 weight %.

By this, influence due to convex and concave shapes of an aluminum having an uneven surface can be decreased by using an aluminum film or a silver film containing substantially no impurity element. As a result, an open circuit voltage of a solar cell can be increased and thus a conversion efficiency can be improved.

In producing the photoreflective electrode, aluminum containing silicon atoms as an impurity element at 0.1 to 6.0 weight %, preferably 0.5 to 2.0 weight % is used as a target, and a substrate temperature is $50°$ to $200°$ C., preferably $70°$ to $150°$ C. Thus, an aluminum film which has an uneven surface and contains an impurity element such as silicon is formed on a substrate by sputtering. Further, an aluminum film or a silver film is formed on the aluminum having an uneven surface by using as a target, aluminum or silver containing substantially no impurity element.

Therefore, by forming the aluminum film or the silver film containing substantially no impurity element on the aluminum film which has a sharp and uneven surface and contains silicon atoms, an photoreflective electrode of a solar cell which has a fine and uneven surface and no sharp or large uneven surface can be formed.

In the solar cell having the photoreflective electrode in which the aluminum film or the silver film containing substantially no impurity element is formed on the aluminum film having an uneven surface, a short current and an open circuit voltage is increased and thus a photoelectric conversion efficiency can be improved largely, in comparison with a solar cell having a conventional uneven surface.

When an organic resin film substrate is used as a substrate in which an aluminum film constructing a photoreflective electrode is formed, gas removing treatment is performed by heating the organic resin film, preferably in a vacuum atmosphere at $10^{-1}$ pa or lower, before the aluminum film is formed on the organic resin film. By heating or a vacuum atmosphere in this gas removing treatment, components released as a gas, such as water, which are contained in the organic resin film are removed. Thus, the fine aluminum film is formed on the organic resin film in comparison with a case wherein the above gas removing treatment is not performed.

Polyethyleneterephthalate (PET), polyethylenenaphthalate (PEN), polyestersulphone (PES), polyimide, or aramid can be used as the organic resin film substrate. In particular, when a polyethylenenaphthalate (PEN) substrate is used as the organic resin film, the gas removing treatment for the organic resin film substrate is performed by heating at $130°$ to $200°$ C., preferably $140°$ to $180°$ C., further preferably about $150°$ C. Further preferably, the gas removing treatment for the organic resin film substrate is performed in a vacuum atmosphere ($1 \times 10^{-1}$ pa or lower).

Then, by forming an aluminum film by sputtering while heating, a fine aluminum film having uniform film quality can be obtained. The aluminum film is formed on the organic resin film substrate for which the gas removing treatment is performed, by sputtering using aluminum containing an impurity element as a target while heating, so that the aluminum film which has fine, uniform film quality, an uneven surface (convex and concave portions) suitable for a photoreflective electrode of a solar cell, and a texture structure can be obtained in comparison with a case wherein the gas removing treatment is not performed.

It is effective to decrease (blunt) convex and concave shapes by forming an aluminum film or a silver film containing no impurity element on the aluminum film.

When sputtering is performed for the organic resin film substrate while heating, since a gas containing hydrogen, oxygen, or nitrogen is released from the substrate during sputtering by heating and a vacuum atmosphere, substrate adhesion of aluminum atoms scattered to the substrate is blocked. Thus, in comparison with a substrate in which a gas is not released, aluminum is adhered sufficiently, so that an aluminum film having a low density is formed.

According to the present invention, by the gas removing treatment of an organic resin film in advance, release of a gas from a substrate is prevented, so that the fine aluminum film having uniform film quality can be formed. If a substrate temperature is increased in the gas removing treatment, a gas removing treatment time is shortened.

It is confirmed by the inventors that the fine aluminum film having a grain size (diameter) of several 100 Å to several 1000 Å, uniform film quality, a texture structure can be obtained by forming an aluminum film on the organic resin film substrate for which the gas removing treatment is performed, by RF sputtering using as a target, pure aluminum (99.99%) containing no impurity element at a substrate temperature of $50°$ to $200°$ C., preferably $70°$ to $150°$ C.

BRIEF DESCRIPTION OF THE DRAWINGS

FIGS. 13A and 13B show surface SEM photographs of an aluminum film;

FIGS. 14A and 14B show surface SEM photographs of an aluminum film;

FIG. 20 shows a characteristic comparison result of the solar cell of the embodiment and the conventional solar cell.

DETAILED DESCRIPTION OF THE PREFERRED EMBODIMENTS

Embodiment 1

This embodiment shows an example of a thin film solar cell using as a photoreflective electrode an aluminum film which has a texture structure and is formed on a flexible organic resin film substrate.

A polyethylenenaphthalate (PEN) film is used as the organic resin film substrate. The aluminum film is formed by a roll to roll type magnetron DC sputter apparatus. A polyethyleneterephthalate (PET), polyestersulphone (PES), polyimide, or aramid can be used as the organic resin film substrate. RF sputtering may be performed.

Figure 1:
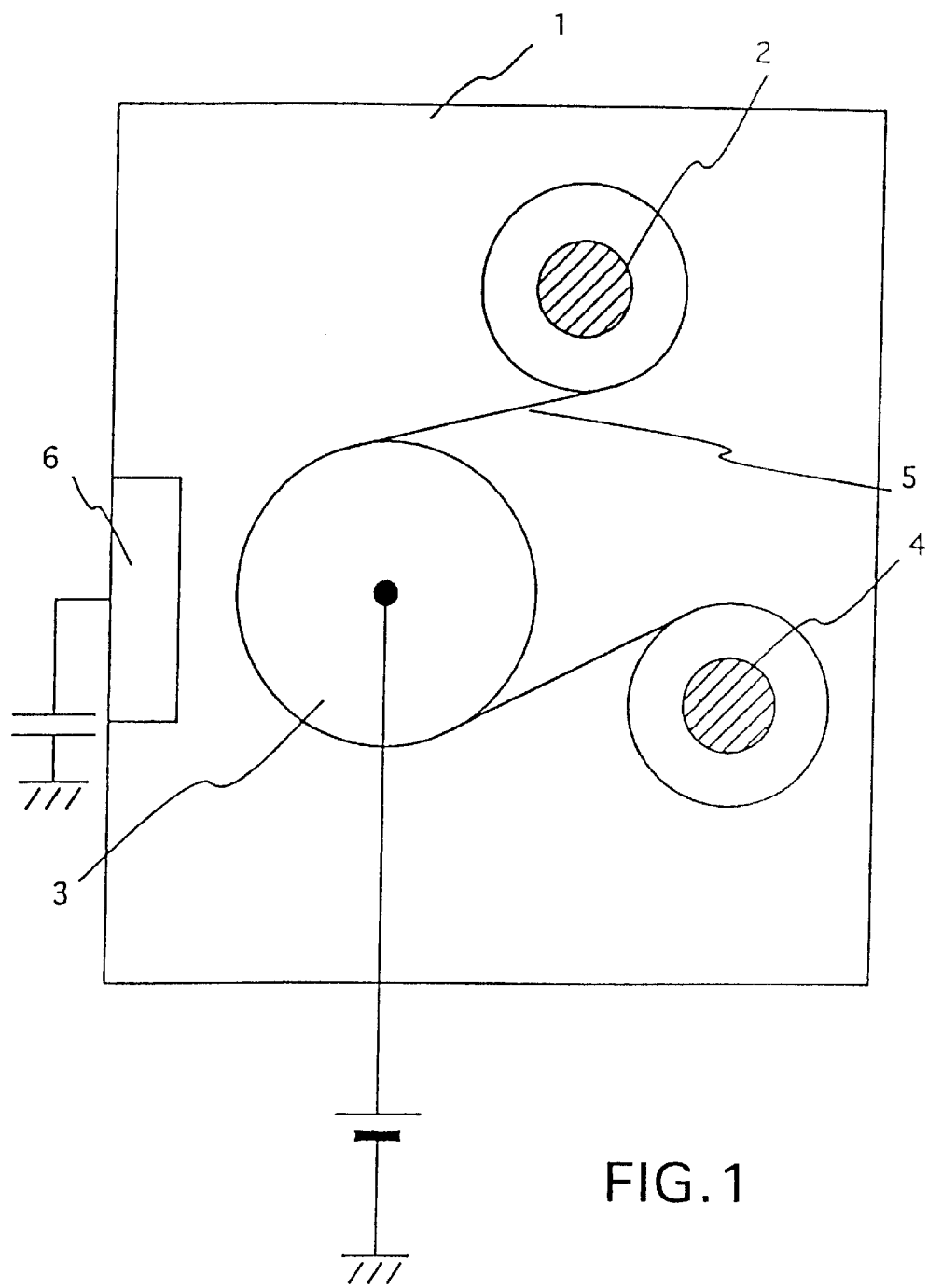
FIG. 1 shows a roll to roll type magnetron DC sputtering apparatus used in Embodiment 1.
Figure 2:
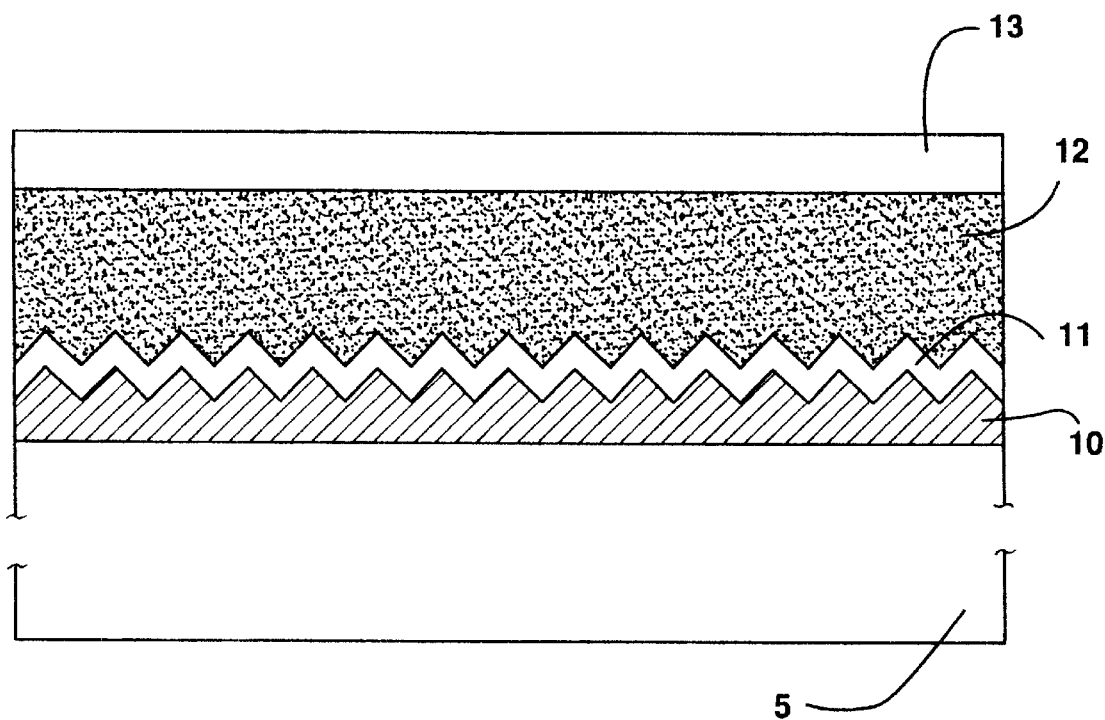
FIG. 2 shows a solar cell in which an aluminum film having a texture structure is used as a photoreflective electrode in Embodiment 1.

FIG. 1 shows a roll to roll type magnetron DC sputtering apparatus used in Embodiment 1. FIG. 2 shows a solar cell in which an aluminum film having a texture structure is used as a photoreflective electrode in Embodiment 1.

Gas removing treatment is performed to remove a gas absorbed into the organic resin film.

In a chamber 1 in the apparatus of FIG. 1, a PEN film roll (having a thickness of 50 to 150 μm, in the embodiment 75 μm) used as a flexible organic resin film substrate 5 is set to an unwinder and a winder 4 through a can 3, so that it is held by tension. The organic resin film substrate 4 can be transferred by drive motors (not shown) provided in the unwinder 2, the can 3 and the winder 4. The chamber 1 is exhausted by a rotary pump and a cryopump (they are not shown) until $1 \times 10^{-1}$ pa or lower, in the embodiment $1 \times 10^{-3}$ pa order, to obtain a vacuum state.

The temperature of the can 3 is controlled by a can heating apparatus (not shown) such as a metal mold temperature regulator, so that the entire organic resin film is heated by rotating the can 3. The substrate temperature of the organic resin film substrate 5 is 130° to 200° C., preferably 140° to 180° C., further preferably about 150° C. The transfer speed of the substrate is controlled so as to maintain the above substrate temperature the organic resin film substrate 5 for few minutes, preferably 5 minutes or longer, so that gas removing treatment is performed.

After the gas removing treatment of the organic resin film substrate 5, the chamber 1 is exhausted again at $1 \times 10^{-5}$ pa order, to obtain a vacuum state, after the exhaust, discharge is produced by using an aluminum target 6 into which silicon atom is added at 1.0 weight %, and then the film is transferred by the can 3, so that DC sputtering is performed. Nickel or copper may be also used as an impurity element added to the aluminum target. The target is cooled by using water from a rear side.

Presputtering (precoating) is performed for about 30 minutes. The applying power is 0.8 kW. A sputtering gas is Argon (Ar) and introduced into the chamber at 100 sccm. A sputtering pressure is set to be 0.5 pa.

By temperature control of the can 3, the substrate temperature of the organic resin film substrate 5 is 50° to 180° C., preferably 70° to 150° C., in the embodiment, 150° C. A film formation speed is 700 to 7000 Å/minute, in the embodiment, 700 Å. A film having a thickness of 2000 to 20000 Å, in the embodiment, 2800 Å is formed.

An example of an formation condition of the aluminum film is as follows.

| | |
|---|---|
| T–S Distance | 85 mm |
| Target Size | 5 × 5 inch |
| Sputtering Pressure | 0.5 pa |
| Sputtering Gas | Argon at 100 sccm |
| Applying Power Density | 1.6 to $10.8 \times 10^{-2}$ W/cm$^2$ |
| Target | Al (Si is doped at 0 to 2 weight %) |
| Film Prebake | at 150° C. for 6 minutes |
| Substrate Temperature | 70 to 150° C. |

The formed aluminum film 10 has a fine texture structure. An average grain size (diameter) of crystal constructing a convex portion is several 100 Å to several 1000 Å. The content of the impurity element in the formed aluminum film is 0.9% by Auger electron spectroscopy method. An average roughness of the surface of the formed aluminum film is 60 nm (measurement by JIS B0601 Rz (10 point average roughness).

Figure 6:
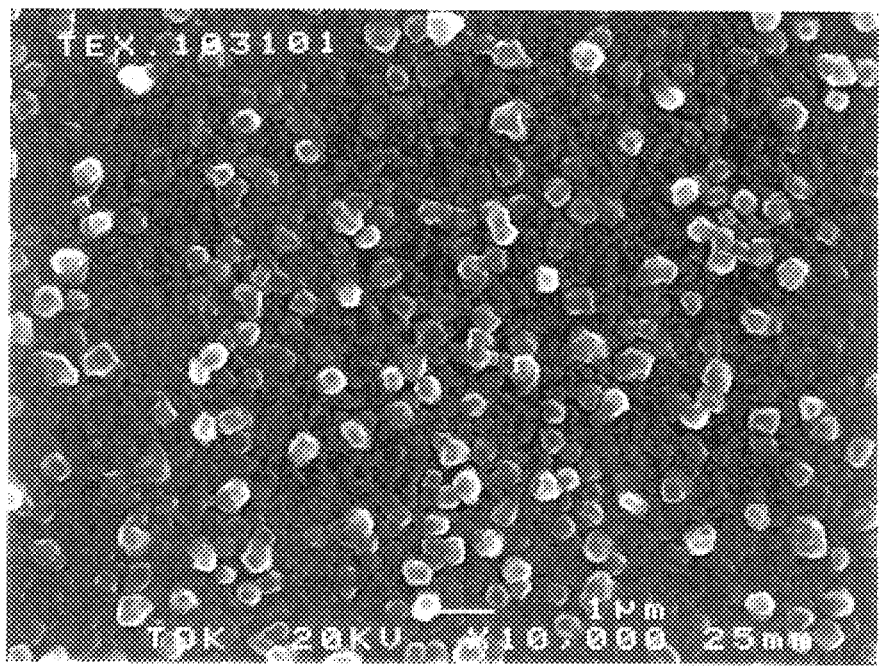
FIG. 6 shows a SEM photograph representing a state of the surface of the aluminum film formed by Embodiment 1.

FIG. 6 shows a SEM photograph representing a state of the surface of the aluminum film formed by Embodiment 1. A large and abnormal grown crystal is not observed.

For comparison, in a case wherein a temperature of the organic resin film substrate 5 is 70° C. and 150° C., a thickness of the formed aluminum film and a view of crystal growth are represented below.

FIGS. 13A and 13B show surface SEM photographs of an aluminum film formed by using an aluminum target into which silicon atoms are added at 0.5 weight % and an aluminum film formed by using an aluminum target into which silicon atoms are not added, in a case wherein the temperature of the organic resin film substrate 5 is set to 70° C. FIG. 14A and 14B show surface SEM photographs of an aluminum film formed by using an aluminum target into which silicon atoms are added at 0.5 weight % and an aluminum film formed by using an aluminum target into which silicon atoms are not added, in a case wherein the temperature of the organic resin film substrate 5 is set to 150° C.

In FIGS. 14A to 15B, crystal having a large grain size is obtained as the substrate temperature is increased, and the crystal having a large grain size is also obtained as a film thickness is increased. When the silicon atom is added, crystals having the same grain size are grown uniformly.

Thus, the aluminum film 10 having a fine texture structure can be formed on the flexible organic resin film substrate 5. A grain size of crystals constructing the texture structure become large as a film thickness of the aluminum film is increased.

Figure 7:
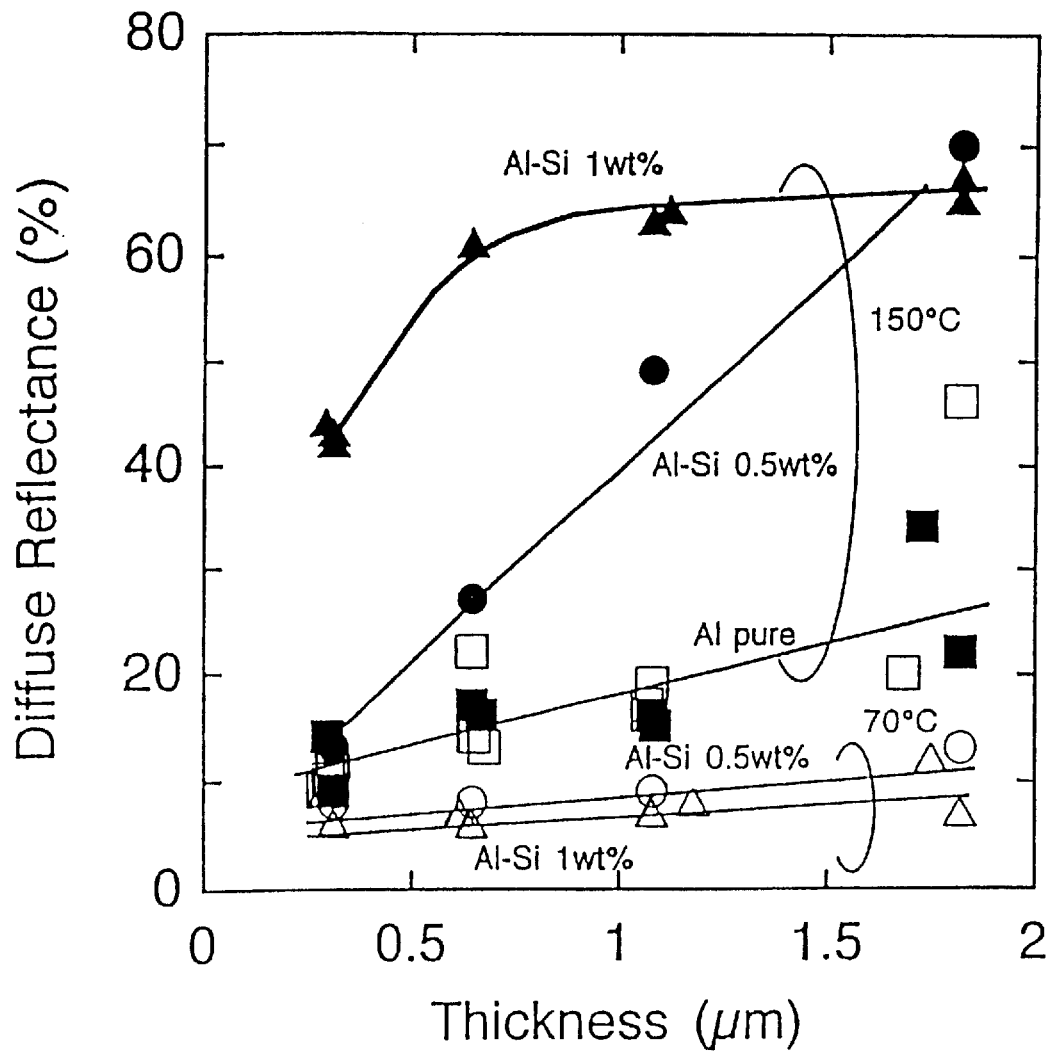
FIG. 7 shows a diffusion reflectance (wavelength of incident light is 650 nm, standard value) with respect to a film thickness of an aluminum film.
Figure 8:
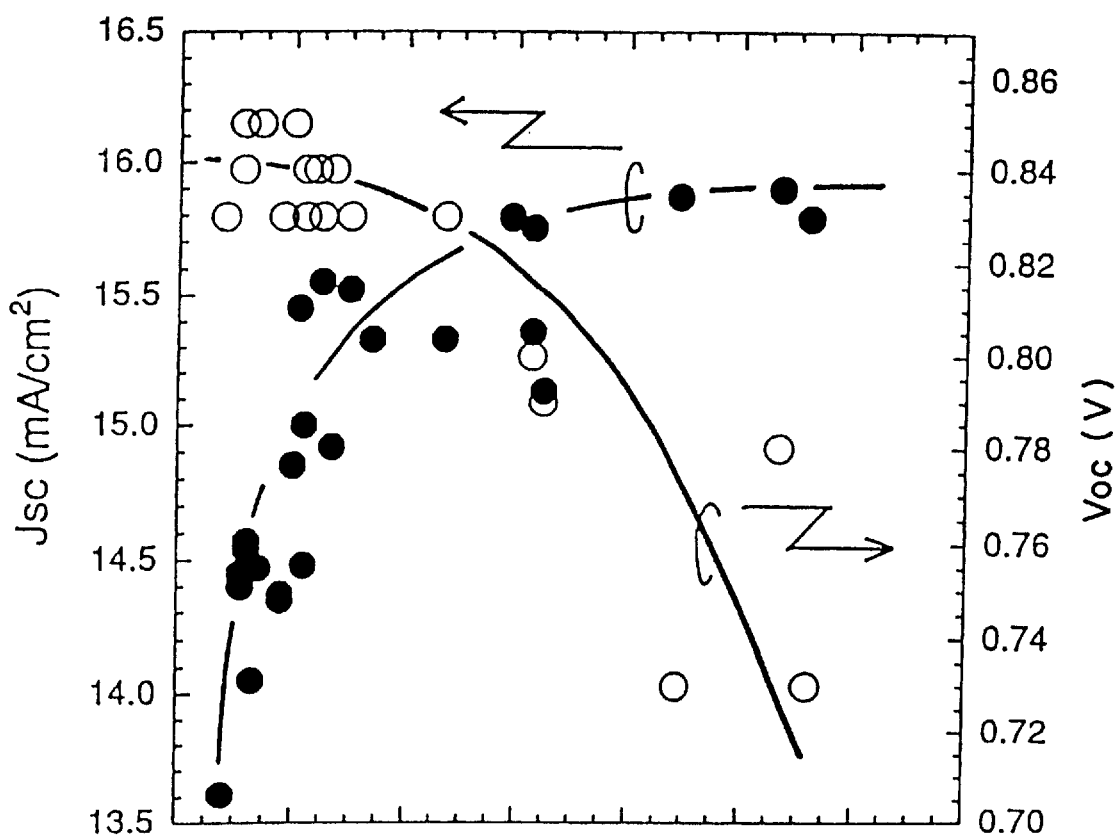
FIG. 8 shows a size (average roughness of surface) of convex and concave shapes of the photoreflective electrode and characteristics of a photocurrent and an open circuit voltage in the solar cell.

FIG. 7 shows a graph representing a diffusion reflectance (wavelength of incident light is 650 nm, standard value) with respect to a film thickness of an aluminum film. From FIG. 7, in a range of 2000 Å to 20000 Å, the diffusion reflectance is increased as a film thickness of an aluminum film is increased.

A zinc oxide (ZnO) having a thickness of 100 to 3000 Å, in the embodiment, about 800 Å, is formed as a barrier layer 11 by sputtering. Stainless steel having a thickness of 10 to 500 Å, e.g., 50 Å, may be used as the barrier layer 11. Also, titanium (Ti), chromium (Cr) or the like may be used.

Figure 15:
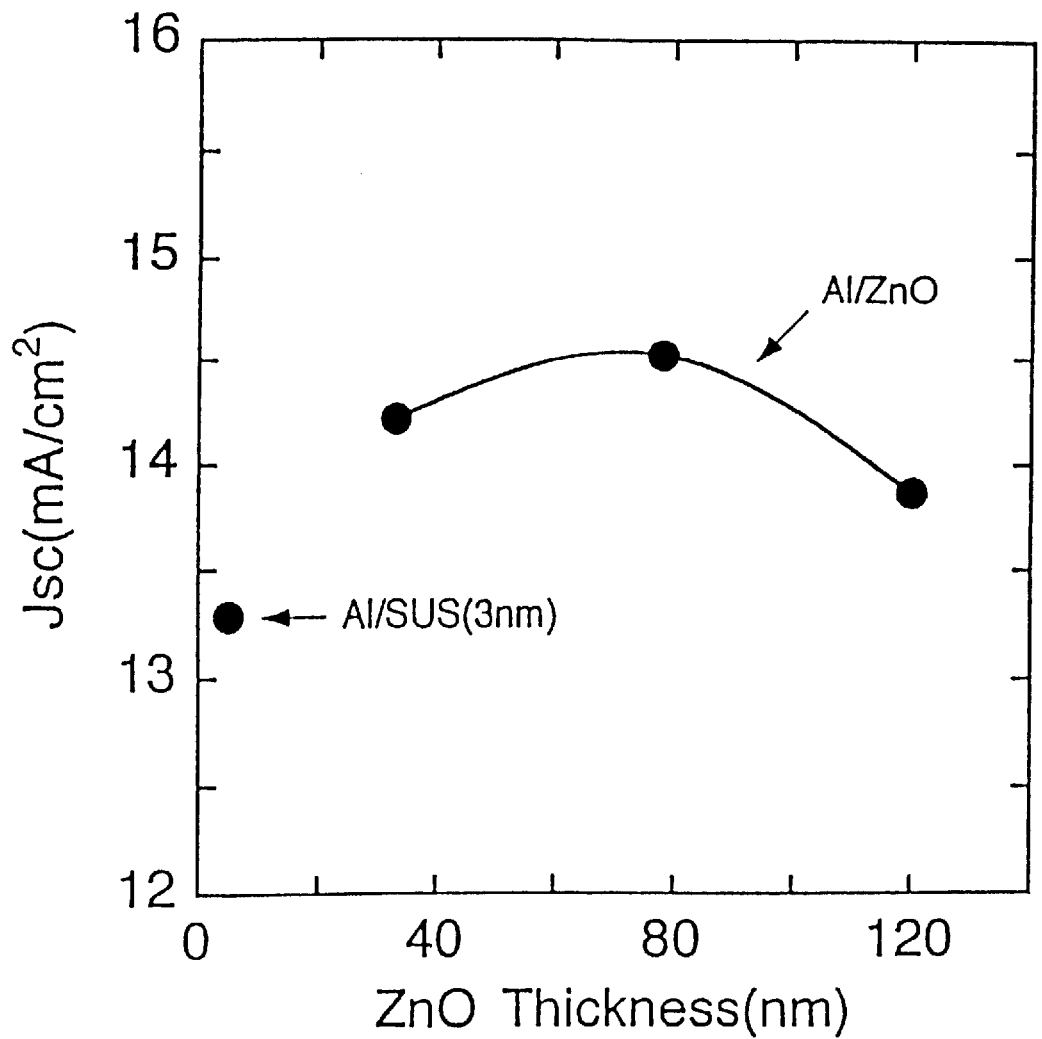
FIG. 15 shows comparison results of a short circuit current of a solar cell in a case wherein the barrier layer is zinc oxide and in a case wherein the barrier layer is stainless steel.

FIG. 15 shows measurement results of a short circuit current of a solar cell in a case wherein the barrier layer is zinc oxide (ZnO) and in a case wherein the barrier layer is stainless steel. In FIG. 15, it is advantageous to use zinc oxide (ZnO) as the barrier layer because it absorbs a long wavelength component of light easily.

A power generating layer 12 is formed. An N-type layer having a thickness of 300 Å, an I-type layer having a thickness of 3000 Å, and a P-type layer having a thickness of 200 Å are formed using an amorphous silicon film by plasma chemical vapor deposition (CVD). The N-type layer and the P-type layer may be a microcrystal silicon thin film or an amorphous silicon thin film having microcrystal.

Then, An ITO (indium tin oxide) film having a thickness of 800 Å is formed as a transparent electrode 13 by sputtering. Wiring electrodes are formed by a printing method and then processed to complete a solar cell.

The aluminum film of the embodiment having a texture structure is compared with a conventional aluminum film (a substrate temperature is a room temperature at sputtering and a target is 99.99% pure aluminum) having no texture structure. In Both, a substrate that the gas removing treatment is performed at 150° C. for 5 minutes is used.

Figure 3:
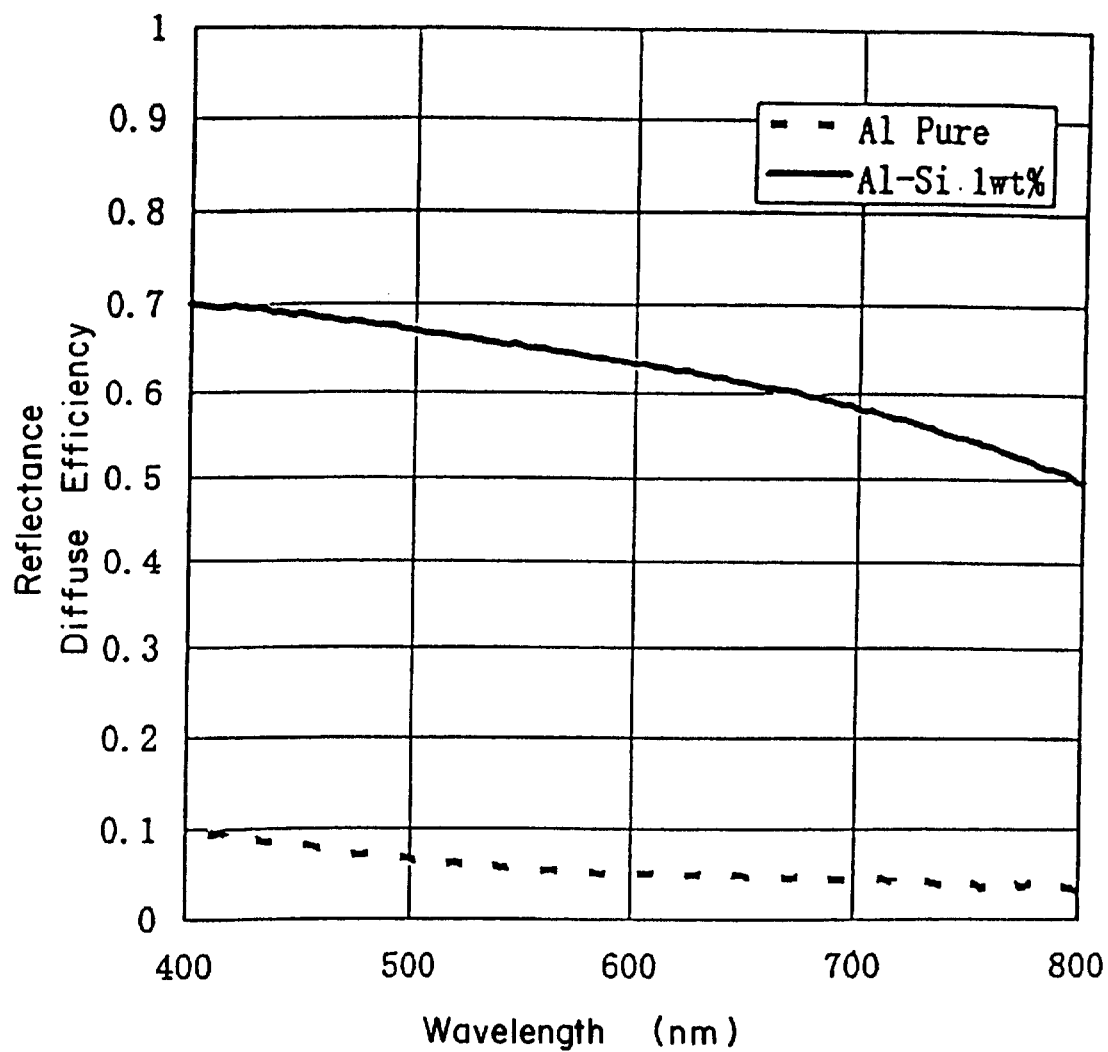
FIG. 3 shows a comparison result of diffusion reflectances of the aluminum of Embodiment 1 and the conventional aluminum film.
Figure 16:
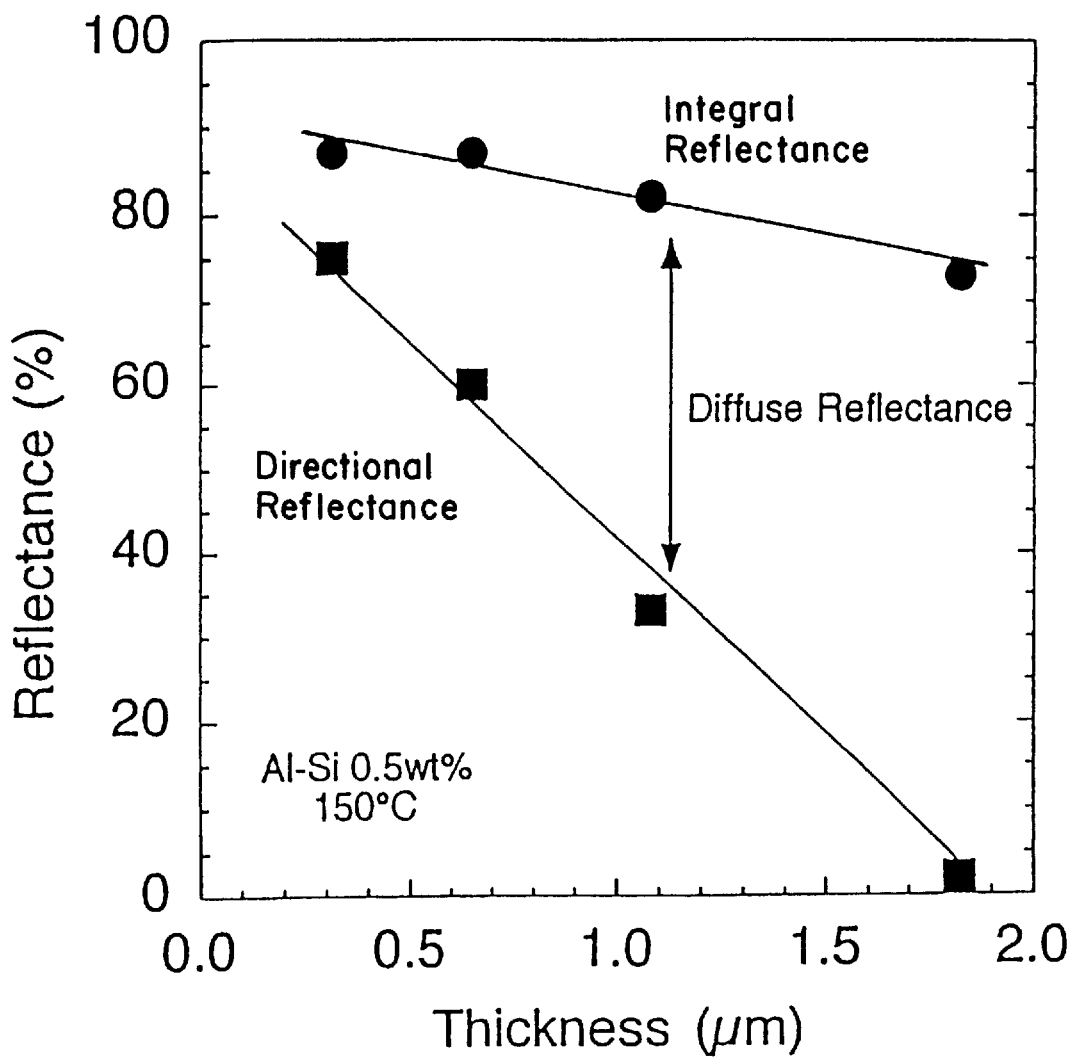
FIG. 16 is a view for explaining a diffusion reflectance.

FIG. 3 shows a comparison result of diffusion reflectances of the aluminum film of Embodiment 1 and the conventional aluminum film. The diffusion reflectance is a value obtained by subtracting a mirror (directional) reflectance from an integral reflectance (See FIG. 16). In FIG. 3, the diffusion reflectance of the aluminum film formed by the embodiment is increased largely.

Figure 4:
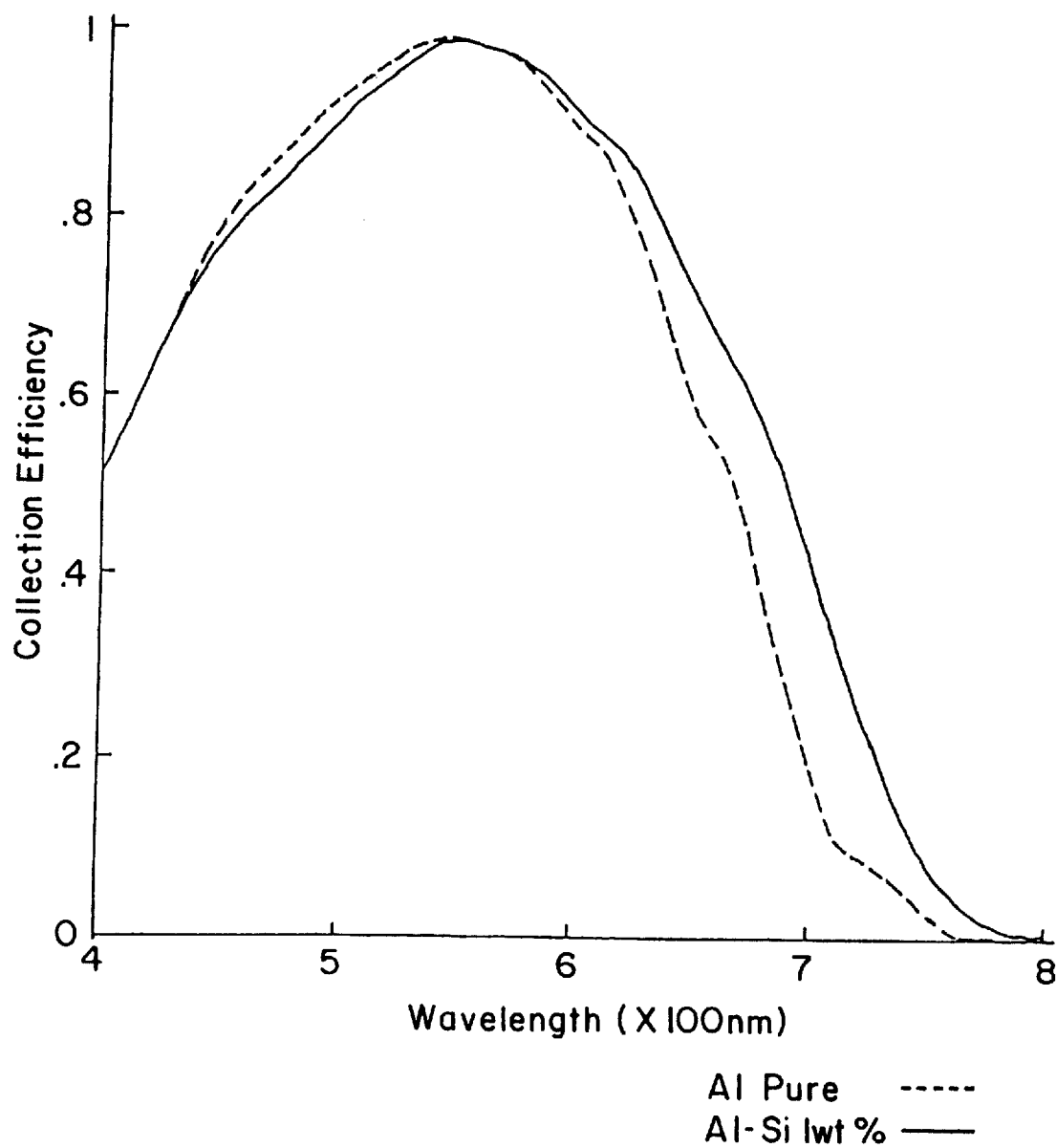
FIG. 4 shows collection efficiencies (for wavelength of incident light) of the solar cell in which the aluminum film of the embodiment is used as a photoreflective electrode and the solar cell in which the conventional aluminum film is used as the photoreflective electrode.
Figure 5:
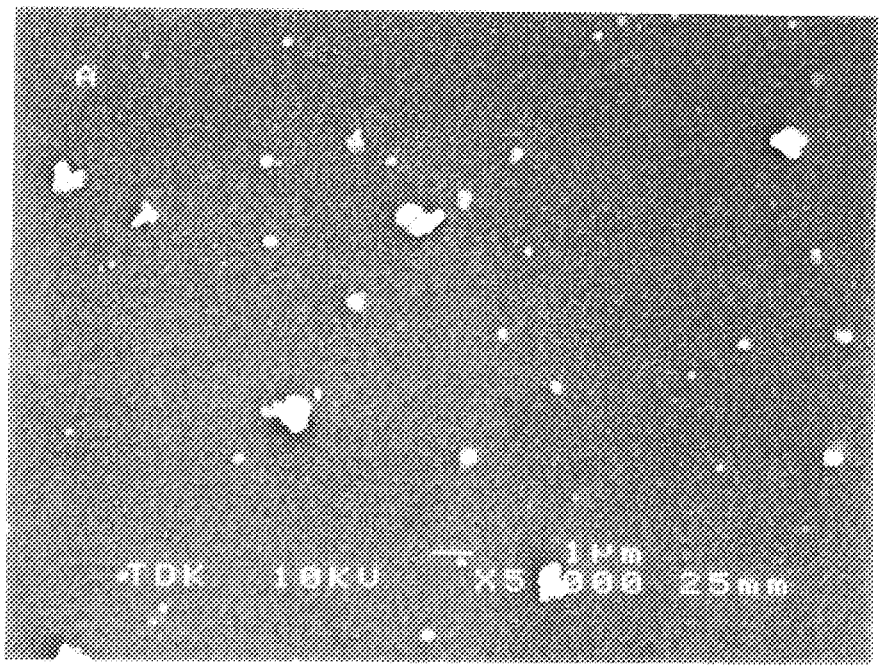
FIG. 5 shows a SEM photograph representing a state that large and abnormal crystal grains are generated in an aluminum film formed by a conventional method.

FIG. 4 shows collection efficiencies (for wavelength of incident light) of the solar cell in which the aluminum film of the embodiment is used as a photoreflective electrode and the solar cell in which the conventional aluminum film is used as the photoreflective electrode. In FIG. 4, by forming the solar cell using the aluminum film of the embodiment as a photoreflective electrode, a collection efficiency of the long wavelength component (wavelength is about 500 to 800 nm) of an incident light can be improved largely.

Figure 19:
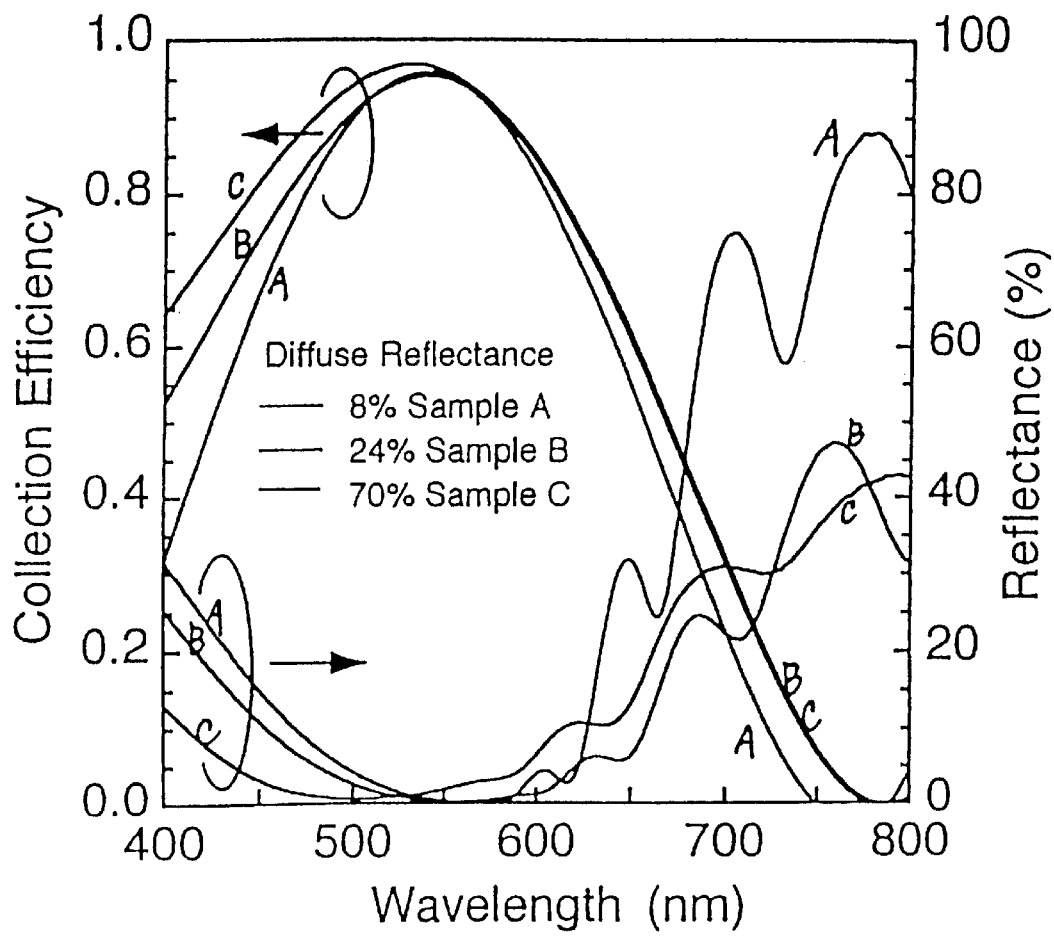
FIG. 19 shows, collection efficiencies and reflectances of the solar cell of the present invention for the wavelength of an incident light.

FIG. 19 shows, in the solar cell formed by using the aluminum film of the embodiment as a photoreflective electrode, collection efficiencies and reflectances of samples for the wavelength of an incident light in a case wherein a diffusion reflectance of the aluminum film 8%, 24%, and 70%. From FIG. 19, when a diffusion reflectance is large, a collection efficiency of the long wavelength component is large and a reflectance of the long wavelength component is small. A small reflectance represents an effective use of an incident light because a quantity of light used for photoelectric conversion is large.

FIG. 20 shows a comparison result of characteristics of the solar cell of the embodiment and the conventional solar cell. An area of solar cells used in the comparison is 1 cm$^2$. In FIG. 20, although an open circuit voltage of the solar cell of the embodiment is decreased by about 1% in comparison with that of the conventional solar cell, a short circuit current of the solar cell of the embodiment is increased by about 11%. Thus, a photoelectric conversion efficiency can be improved by about 8%.

In the embodiment, when, without performing the gas removing treatment for the organic resin film substrate 5, the aluminum film into which silicon atoms are added as an impurity element at 1.0 weight % is formed by sputtering, a texture structure is obtained by growing crystal grains. However, a film quality is deteriorated, and conductivity, photoreflectance or the like is reduced in comparison with a case wherein the gas removing treatment is performed.

Embodiment 2

In this embodiment, a solar cell is produced by forming an aluminum film on a glass substrate by RF sputtering. The substrate is Corning 7059 glass. This substrate is placed in a chamber and then the chamber is exhausted until $7 \times 10^{-4}$ pa to obtain a vacuum state. A substrate temperature is 50° to 200° C., preferably 70° to 150° C., in the embodiment 150° C.

Presputtering (precoating) is performed for 30 minutes. Main sputtering is performed for 10 minutes. A sputtering pressure is 0.5 pa. A sputtering gas is argon (Ar) and introduced at 85 sccm. A sputtering power is 1.3 W/cm$^2$. A sputtering rate (a film forming rate) is 300 Å/minute.

Thus, an aluminum film into which silicon atom is added at 1.0 weight % is formed at a thickness of 3000 Å. The aluminum film has a fine texture structure, and an average grain size of crystals constructing a convex portion is several 100 Å to several 1000 Å. A zinc oxide (ZnO) having a thickness of 100 to 3000 Å, in the embodiment, about 800 Å, is formed as a barrier layer by sputtering.

A power generating layer is formed. An N-type layer having a thickness of 300 Å, an I-type layer having a thickness of 3000 Å, and a P-type layer having a thickness of 200 Å are formed using an amorphous silicon film by plasma CVD. The N-type layer and the P-type layer may be a microcrystal silicon thin film or an amorphous silicon thin film having microcrystal.

Then, an ITO film having a thickness of 800 Å is formed as a transparent electrode by sputtering. Wiring electrodes are formed by a printing method and then processed to complete a solar cell.

Thus, the solar cell is produced on a glass substrate by using the aluminum film (having a texture structure) formed by RF sputtering using a target of aluminum into which silicon is added at 1.0 weight % as an impurity element. Since it effectively absorbs the long wavelength component of light in comparison with a conventional case wherein an even aluminum film is used as a photoreflective electrode, a photoelectric conversion efficiency can be improved largely.

Embodiment 3

In this embodiment, an aluminum film having a texture structure and a silver film (for decreasing or blunting the convex and concave portions formed on the surface of the aluminum film) formed thereon are formed on a flexible organic resin film substrate to obtain a photoreflective electrode, and a thin film solar cell is produced by using the obtained photoreflective electrode.

Figure 9:
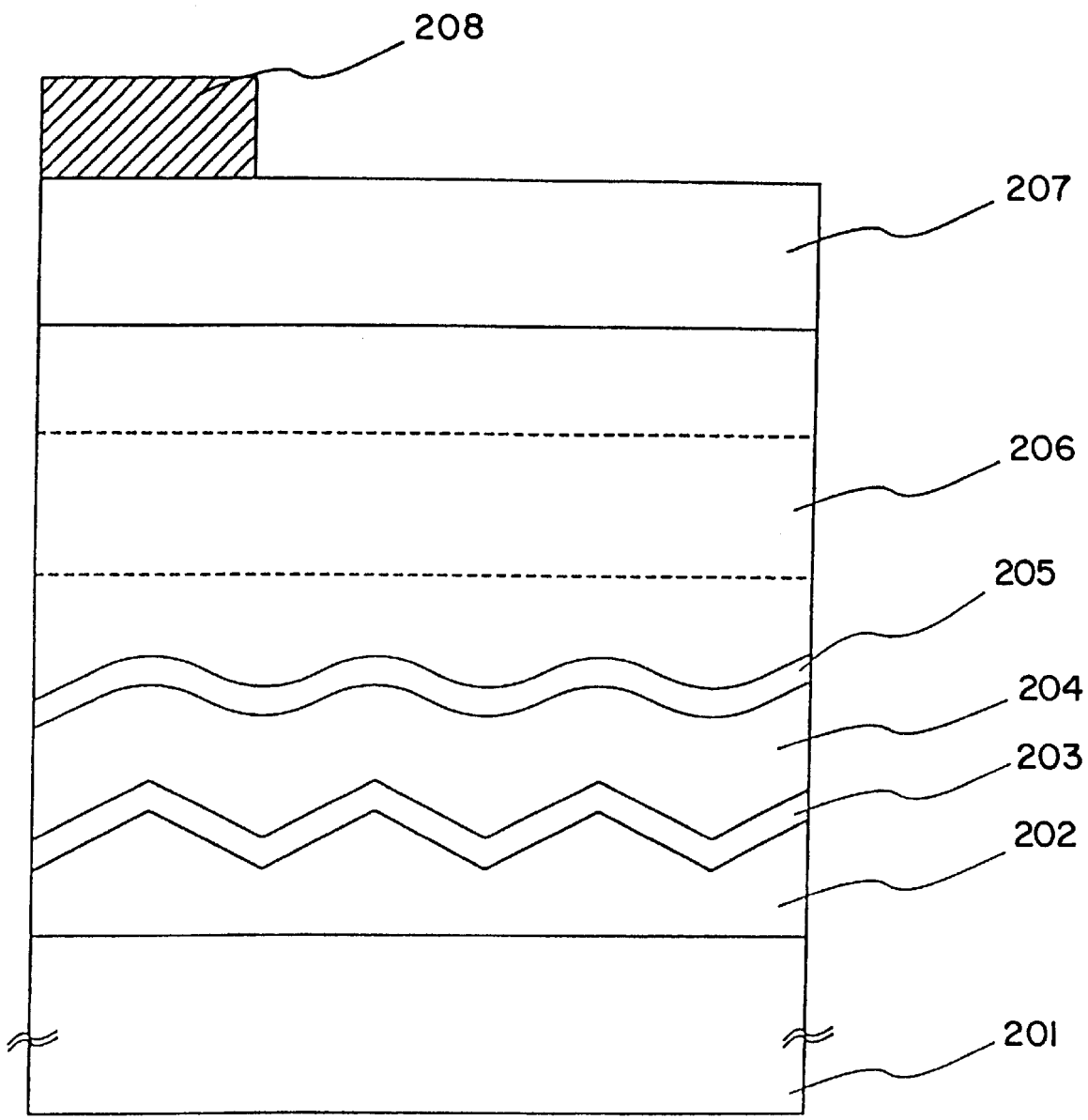
FIG. 9 shows a cross section structure of a solar cell of Embodiments 3 and 4.

FIG. 9 shows a cross section structure of a solar cell of Embodiment 3. This solar cell includes a substrate 201 made of an organic resin film, a photoreflective electrode, a photoelectric conversion layer 206 made of amorphous silicon, a transparent electrode 207 made of an ITO (indium tin oxide) alloy, and an auxiliary electrode 208 formed on the transparent electrode 207. The photoreflective electrode has an aluminum film 202 which has convex and concave shapes and contains a silicon atom, a diffusion blocking layer 203 made of stainless steel, a silver layer 204, and a zinc oxide film 205, these films are laminated. An aluminum film containing substantially no impurity element instead of the silver film 204 may be used.

An electrode film used as a photoreflective electrode of a solar cell is formed by a roll to roll type magnetron DC (direct current) sputtering apparatus. An organic resin film substrate is a polyethylenenaphthalate (PEN) film substrate having a thickness of 75 μm. A polyethyleneterephthalate (PET), a polyestersulphone (PES), a polyimide, or the like can be also used as the organic resin film substrate. A magnetron high frequency (radio frequency, RF) sputtering can be also performed.

Figure 10:
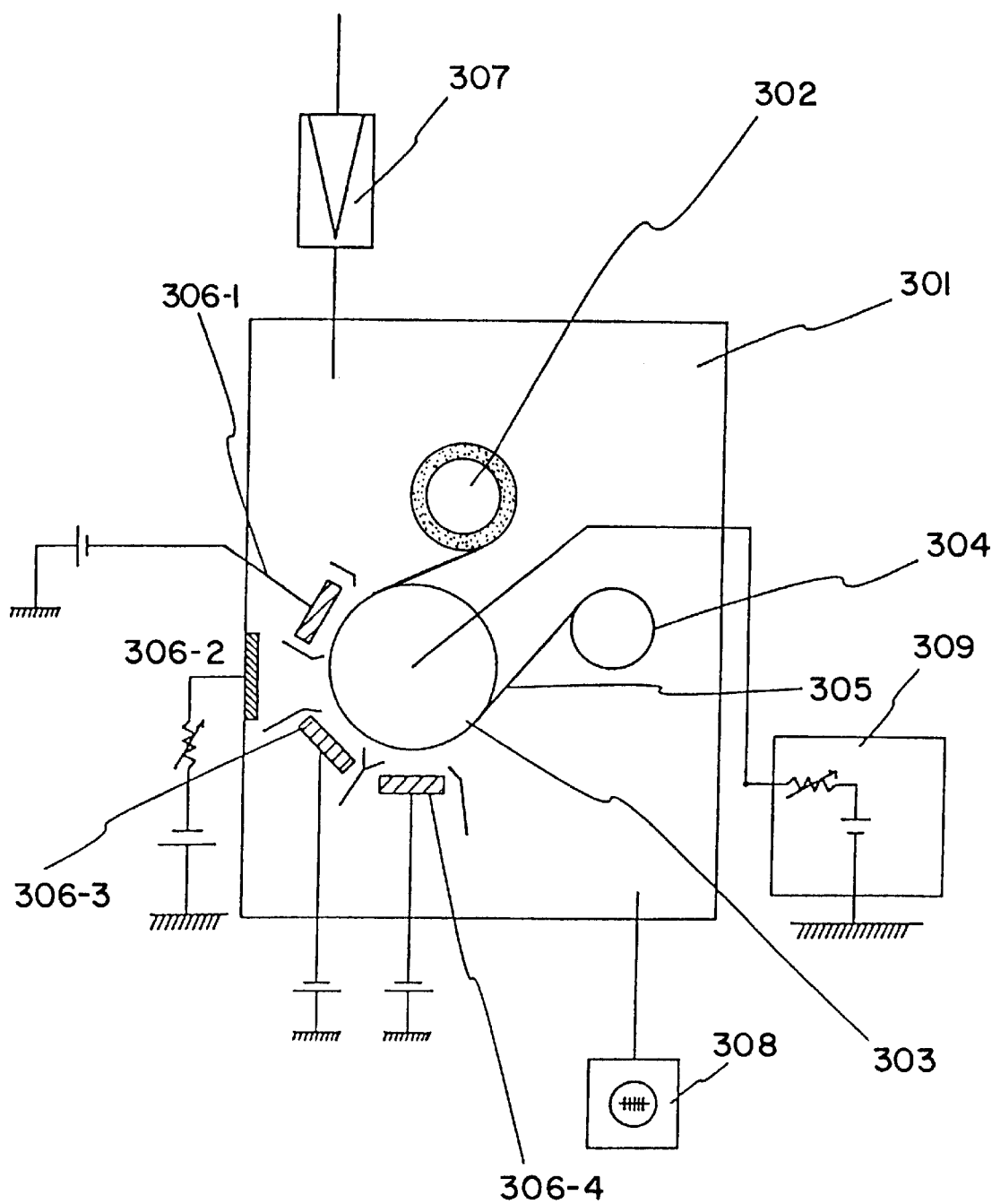
FIG. 10 shows a roll to roll type magnetron DC sputtering apparatus used in Embodiment 3.

FIG. 10 shows a roll to roll type magnetron DC sputtering apparatus used in Embodiment 3. In FIG. 10, a PEN film which has a thickness of 50 to 150 μm, in the embodiment 75 μm and is used as a flexible organic resin film substrate 305 is placed in a chamber 301 and set to an unwinder 304 through a can 303, so that it is held by tension. The organic resin film substrate 305 is transferred by drive motors (not shown) provided in the unwinder 302, the can 303 and the winder 304.

Targets 306-1, 306-2, 306-3 and 306-4 are arranged along a substrate transfer direction. A deposition speed is controlled by a slit provided between the target and the substrate and discharge power to be supplied.

The target 306-1 is used to form an aluminum film having an uneven surface (convex and concave shapes on a surface) by using a target of aluminum containing silicon atom as an impurity element at 0.1 to 6.0 weight %, in the embodiment 1.0 weight %. The target 306-2 is made of stainless steel and used to form a diffusion blocking layer so as not to react the formed aluminum film with a silver film formed thereon. The target 306-3 is made of silver and used to form a film for decreasing or blunting convex and concave shapes. Aluminum containing substantially no impurity element instead of silver may be used. The target 306-4 is made of zinc oxide and used to form a diffusion blocking layer so as not to react a base film with silicon formed thereon.

The chamber 301 is exhausted by an exhaust system 308 such as a rotary pump and a cryopump until about $1 \times 10^{-3}$ pa, to obtain a vacuum state. Before forming a film, gas removing treatment is performed to remove a gas in an atmosphere which is absorbed in the organic resin film.

The temperature of the can 303 is controlled by a can heating apparatus 309, so that the organic resin film substrate 305 can be heated by transfer of the substrate 305 and rotation of the can 3. The substrate temperature in the gas removing treatment is 130° to 200° C., preferably 140° to 180° C., in the embodiment 150° C. The transfer speed of the substrate is controlled so as to maintain the above substrate temperature of the organic resin film substrate 305 for few minutes, preferably 5 minutes or longer, so that gas removing treatment is performed for an entire roll-like film substrate.

After the gas removing treatment of the organic resin film substrate 305, the chamber 301 is exhausted again at $1 \times 10^{-5}$ Pa order, to obtain a vacuum state, after the vacuum exhaust, a pure argon gas is introduced from a gas supplying system 307 into the chamber 301 at 100 SCCM. The chamber 301 is maintained at a pressure of 0.5 Pa by a pressure regulating unit provided in the exhaust system 308.

Then, glow discharge is produced by supplying a direct current power to the target, to initiate sputtering film formation. Presputtering (precoating) is performed to remove contamination adhered on the surface of the target in general. In the embodiment, presputtering is performed for 30 minutes while transferring the organic resin film substrate 305. The substrate temperature of the organic resin film substrate 305 is controlled so as to maintain 50° to 200° C., in the embodiment 150° C. by the can heating apparatus 309 connected to the can 303.

After the presputtering, main sputtering is performed. A thickness of a film deposited on the organic resin film substrate can be regulated by direct current power and a transfer speed of the film substrate.

In the embodiment, since films having different film formation speeds are laminated continuously, a film thickness of each layer is controlled by regulating the direct current power supplied to the target while a transfer speed of the film substrate is constant. A film formation speed of an aluminum film can be set to be 70 to 700 nm/minute, in the embodiment 200 nm/minute, so that a film having a thickness of 1000 nm is formed. The content of an impurity element in the formed aluminum film is 0.5% (Auger electron spectroscopy method).

Figure 17:
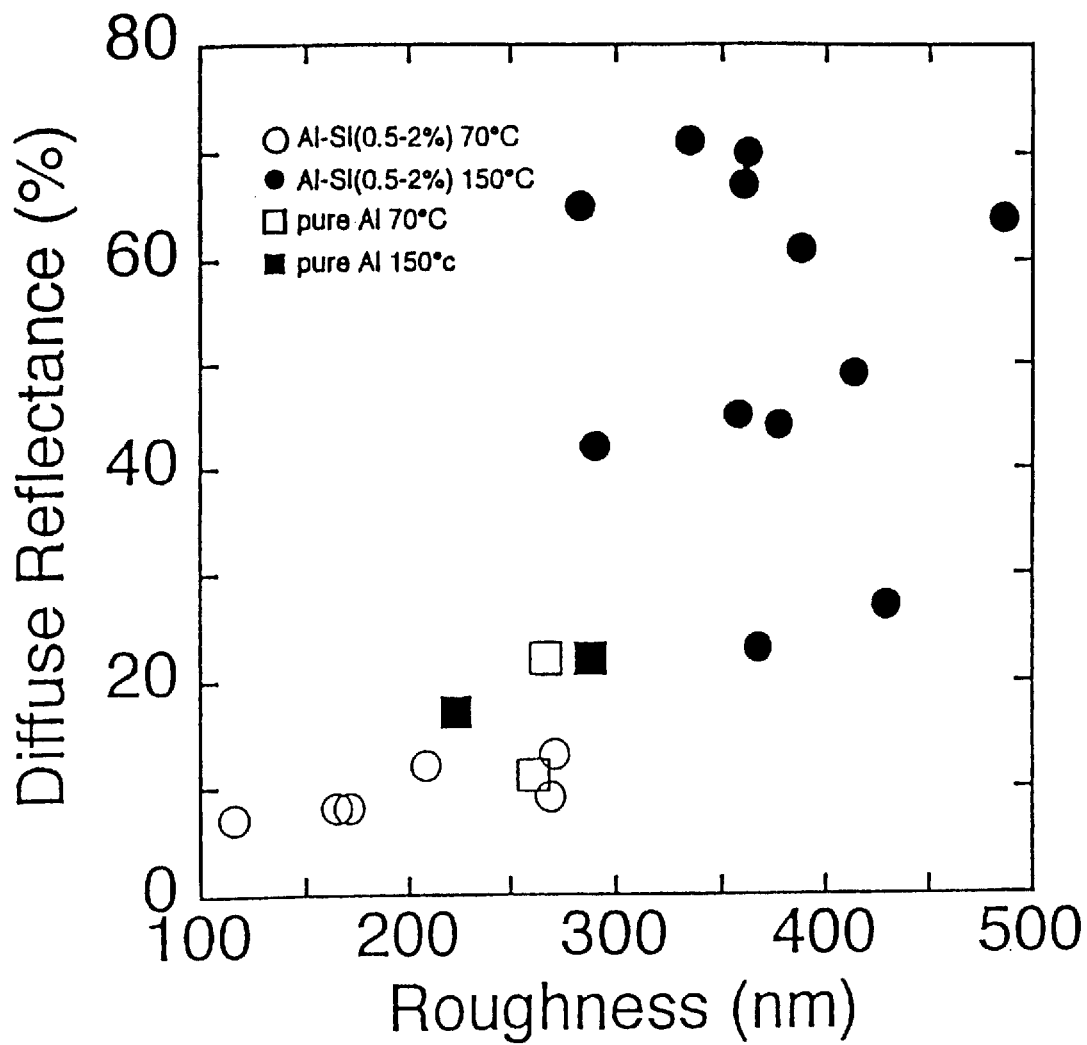
FIG. 17 shows a relationship between an average roughness of the surface and a diffusion reflectance.

An average roughness of the surface of the aluminum film is 90 nm (measurement by JIS B0601 Rz (10 point average roughness)). FIG. 17 shows a relationship between an average roughness of the surface and a diffusion reflectance. The average roughness is measured by the above 10 point average roughness. In FIG. 17, the diffusion reflectance is increased as the average roughness is increased.

A film formation speed of a stainless steel film can be set to be 1 to 100 nm/minute, in the embodiment 2 nm/minute, so that a film having a thickness of 10 nm is formed. A film formation speed of a silver film can be set to be 10 to 500 nm/minute, in the embodiment 10 nm/minute, so that a film having a thickness of 100 nm is formed.

When aluminum containing substantially no impurity element instead of silver is used, a film formation speed thereof is 20 to 500 nm/minute, e.g., 20 nm/minute, so that a film having a thickness of 100 nm is formed.

A film formation speed of a zinc oxide film can be set to be 30 to 250 nm/minute, in the embodiment 160 nm, so that a film having a thickness of 80 nm is formed.

Figure 18:
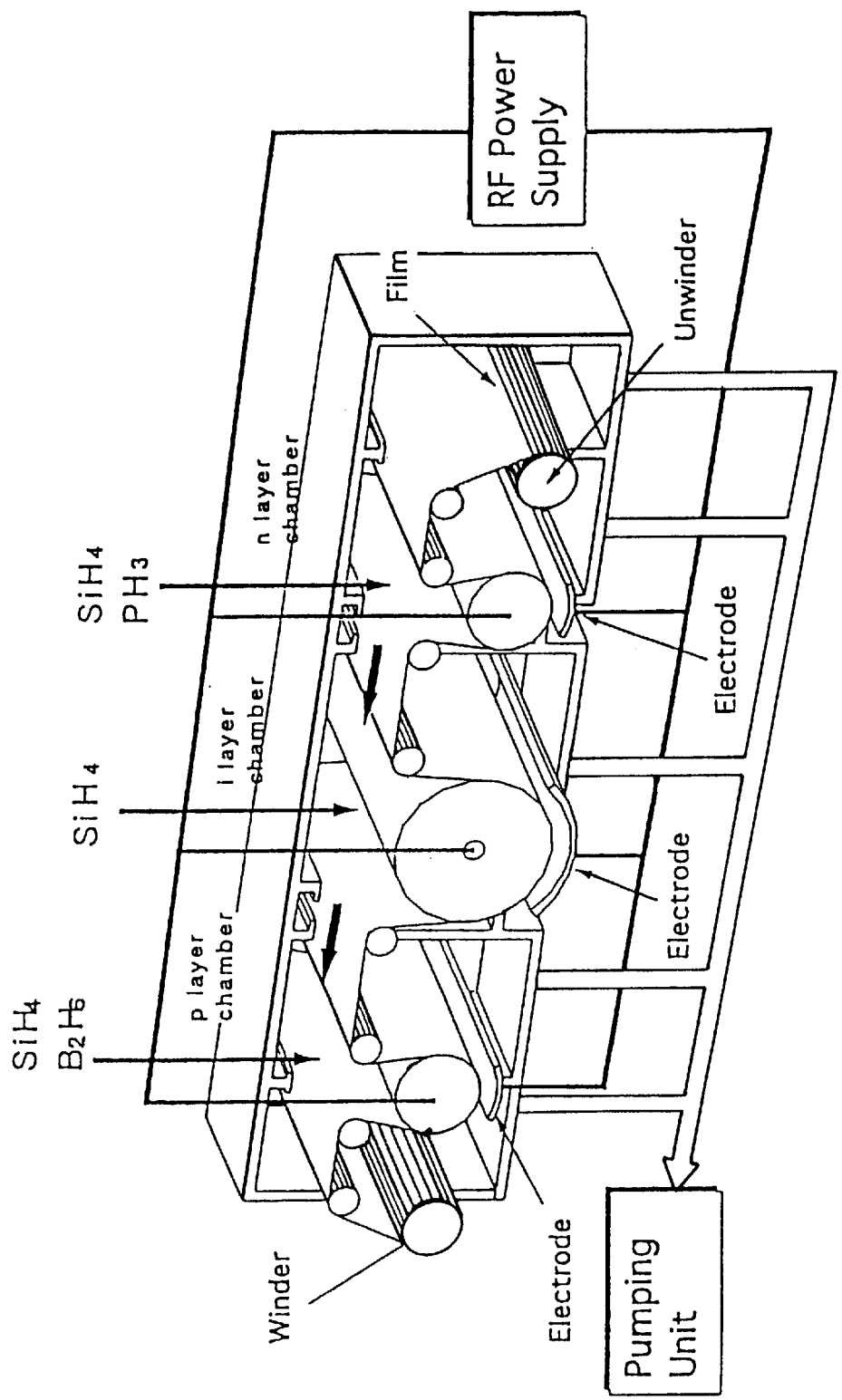
FIG. 18 shows a plasma CVD apparatus.

A photoelectric conversion layer is formed. An N-type layer having a thickness of 300 Å, a substantially intrinsic I-type layer having a thickness of 5000 Å, and a P-type layer having a thickness of 200 Å are formed in order in an amorphous silicon layer by plasma CVD using the apparatus of FIG. 18. The N-type layer and the P-type layer may be a microcrystal silicon thin film or an amorphous silicon thin film having microcrystal.

After the photoelectric conversion film is formed, an indium tin oxide (ITO) alloy film having a thickness of 800 Å is formed as a transparent electrode by sputtering, a sheet resistance of the ITO film is 100 to 1000 Ω/square and thus the ITO film has a high resistance as an electrode of a solar cell, so that a grid-like electrode made of silver is formed as an auxiliary electrode on the ITO film.

Lead electrodes are formed in the photoreflective electrode side and the transparent electrode side and wiring-processed to complete a solar cell.

Figure 11:
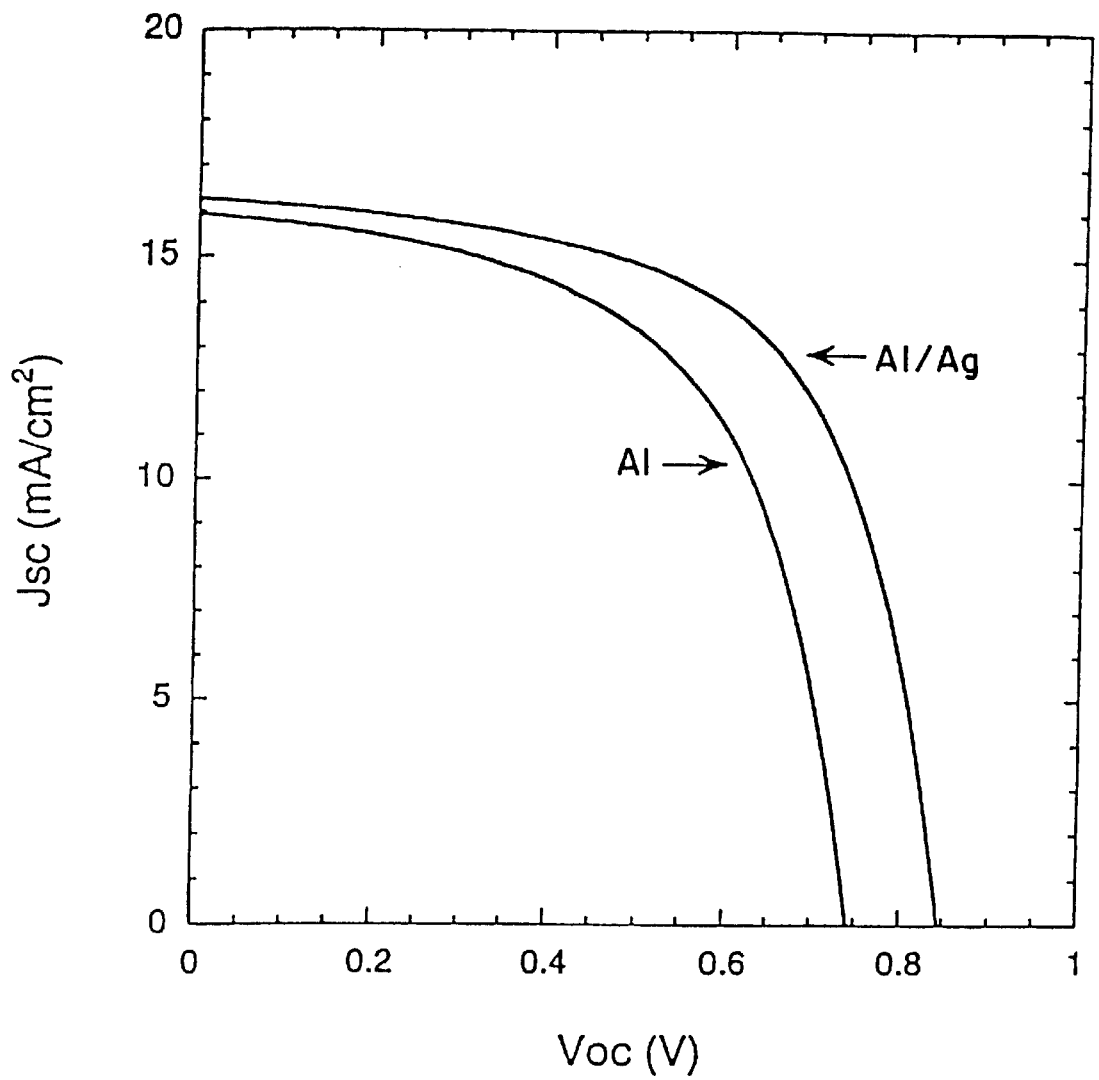
FIG. 11 shows a comparison result with respect to characteristics of the solar cell of Embodiment 3 and a conventional solar cell.
Figure 12:
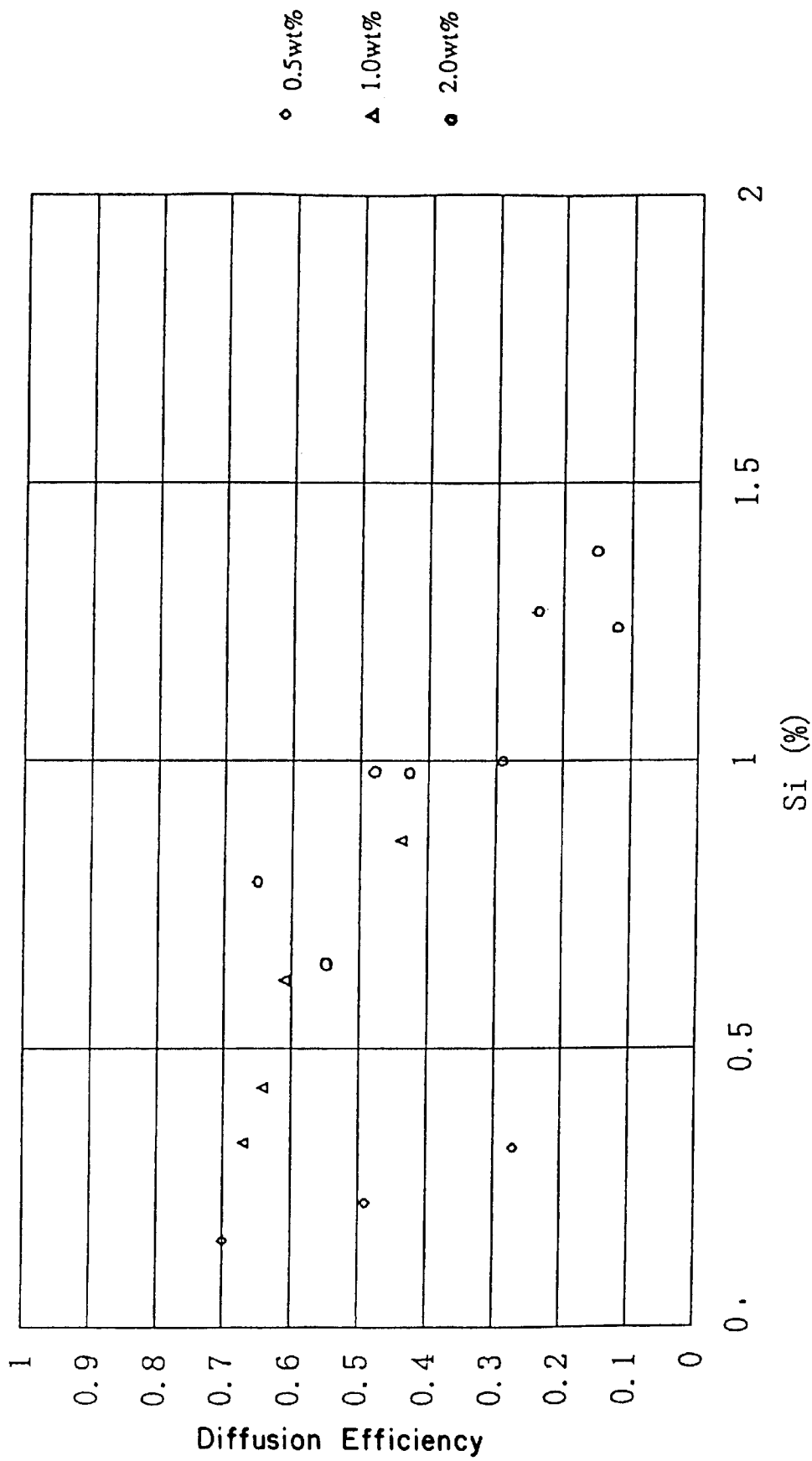
FIG. 12 shows a relationship between the content of silicon as an impurity element in the aluminum film and the diffusion reflectance of the aluminum film.

FIG. 11 shows a comparison result of current-voltage characteristics of the solar cell of Embodiment 3 and a conventional solar cell produced by using an aluminum film having convex and concave shapes, as shown in FIG. 11, in the solar cell of Embodiment 3, a short circuit current is increased by about 0.3 mA and thus is 16.3 mA, and an open circuit voltage is increased by 0.1 V and thus is 0.84 V in comparison with the conventional solar cell. The open circuit voltage value is the same value as a case wherein a flat substrate having no convex and concave shapes is used.

This result may be obtained by forming two layer structure of an aluminum film (which has convex and concave shapes and contains silicon atom) and a silver film (which has a function for decreasing or blunting the convex and concave shapes) as a photoreflective electrode.

In the solar cell of Embodiment 3 produced by using the photoreflective electrode which has the convex and concave shapes and on which the aluminum film containing silicon as an impurity element and a silver formed thereon are laminated, a photoelectric conversion efficiency can be improved largely in comparison with a conventional solar cell produced by using a photoreflective electrode having no convex and concave shapes and a conventional solar cell produced by using a photoreflective electrode having convex and concave shapes.

When an aluminum film containing substantially no impurity element instead of a silver film is used, convex and-concave shapes of the aluminum film having an uneven surface can be decreased (blunted) and an open circuit voltage can be improved in similar to the silver film. However, since a photoreflectance of aluminum is lower than that of silver, a short circuit current is decreased to some extent. Thus a conversion efficiency of a solar cell is reduced to some extent in comparison with a case wherein silver is used.

Embodiment 4

In this embodiment, a solar cell is produced by forming a photoreflective electrode on a glass substrate by magnetron DC sputtering. The solar cell has the same structure as FIG. 9. A substrate is Corning 7059 glass. A sputtering apparatus is general, and a photoreflective electrode is formed by changing a target timely. Also, necessary targets are arranged in a reactive chamber and substrates are transferred in turn and processed, so that films can be formed continuously.

A photoreflective electrode is formed. In a chamber of a sputtering apparatus, after a glass substrate and a target of aluminum into which silicon atom is added as an impurity element at 0.1 to 6.0 weight %, in the embodiment 1.0 weight % are placed, the chamber is exhausted until $7 \times 10^{-4}$ Pa to obtain a vacuum state. A substrate temperature is 50° to 200° C., preferably 70° to 150° C., in the embodiment 150° C.

Presputtering (precoating) is performed for 30 minutes. Then, main sputtering for forming a film on the substrate is performed. In the main sputtering, a sputtering gas is argon (Ar) and supplied into the chamber at 85 SCCM, so that a pressure in the chamber is maintained at 0.5 Pa.

When direct current power of 800 W is applied to the target, a film formation speed of 100 nm/minute is obtained. Thus, by the film formation for 10 minutes, an aluminum film which has a thickness of 1000 nm and contains silicon atom is formed. The formed aluminum film has convex and concave shapes on the surface thereof.

After the target is changed, by the same manner, a stainless steel film having a thickness of 1 to 20 nm, in the embodiment 10 nm, a silver film having a thickness of 10 to 200 nm, in the embodiment 100 nm, and a zinc oxide film having a thickness of 10 to 300 nm, in the embodiment 80 nm are laminated in order.

To form a photoelectric conversion layer, an N-type layer having a thickness of 30 nm, an I-type layer having a thickness of 500 nm, and a P-type layer having a thickness of 20 nm are formed using an amorphous silicon film by plasma CVD. The N-type layer and the P-type layer may be a microcrystal silicon thin film or an amorphous silicon thin film having microcrystal.

An indium tin oxide (ITO) alloy film having a thickness of 80 nm is formed as a transparent electrode by sputtering. A sheet resistance of the ITO film is 100 to 1000 Ω/square and thus the ITO film has a high resistance as an electrode of a solar cell, so that a grid-like electrode made of silver is formed as an auxiliary electrode on the ITO film.

Lead electrodes are formed in the photoreflective electrode and the transparent electrode and wiring-processed to complete a solar cell.

In the solar cell of Embodiment 4 formed on the glass substrate, an open circuit voltage is increased and a conversion efficiency can be improved in comparison with a conventional solar cell in which a silver film is not formed on an aluminum film having an uneven surface.

As described above, by the present invention, the aluminum film having a fine texture structure which is superior as a photoreflective electrode of a solar cell can be formed. In the solar cell using the aluminum film having the fine texture structure as the photoreflective electrode, a photoelectric conversion efficiency can be improved largely in comparison with a case wherein a conventional flat aluminum film is used.

Also, since abnormal and large growth of the crystal can be prevented, occurrence of a short circuit between a transparent electrode and a photoreflective electrode of a solar cell can be prevented.

Further, by forming a silver or aluminum film on the aluminum film having a texture structure, a photoreflective electrode of a solar cell which has a fine texture structure and have not a sharp convex and concave shapes can be obtained in comparison with a case wherein an aluminum film constructing a photoreflective electrode has simply convex and concave shapes. In the solar cell using the photoreflective electrode, an open circuit voltage is increased and thus a photoreflective conversion efficiency can be improved largely in comparison with a conventional solar cell using a photoreflective electrode having convex and concave shapes.

Furthermore, when an organic resin film substrate is used, the aluminum film having a fine and uniform texture structure can be obtained. By using the aluminum film as a photoreflective electrode, a photoelectric conversion efficiency of a solar cell on the organic resin film substrate can be improved largely.

What is claimed is:

1. A solar cell comprising:
   a substrate comprising an organic resin;
   a conductive film comprising aluminum formed on the substrate;
   a photoelectric conversion layer formed over the conductive film;
   a transparent electrode formed on the photoelectric conversion layer; and
   a conductive barrier layer interposed between said conductive film and said photoelectric conversion layer,
   wherein said conductive barrier layer comprises stainless steel.

2. A solar cell according to claim 1 wherein said organic resin is selected from the group consisting of polyethyleneterephthalate, polyethylenenaphthalate, polyestersulphone, polyimide, and aramid.

3. A solar cell comprising:
   a substrate;
   a conductive film comprising aluminum and containing at least one of silicon, nickel and copper at 0.1 to 6.0 weight %;
   a photoelectric conversion layer formed over the conductive film;
   a transparent electrode formed on the photoelectric conversion layer; and
   a conductive barrier layer interposed between said conductive film and said photoelectric conversion layer, wherein said conductive film has a textured surface, of which average surface roughness is 50 nm or more.

4. A solar cell according to claim 3 wherein said substrate comprises an organic resin.

5. A solar cell according to claim 3 wherein said conductive barrier layer comprises stainless steel.

6. A solar cell comprising:

a substrate;

a conductive film comprising aluminum and containing at least one of silicon, nickel and copper;

a photoelectric conversion layer formed over the conductive film;

a transparent electrode formed on the photoelectric conversion layer; and a conductive barrier layer interposed between said conductive film and said photoelectric conversion layer, wherein conductive barrier layer comprises stainless steel.

7. A solar cell according to claim 6 wherein said at least one of silicon, nickel and copper is contained at 0.1 to 6.0 weight %.

* * * * *

UNITED STATES PATENT AND TRADEMARK OFFICE
CERTIFICATE OF CORRECTION

PATENT NO.   : 5,891,264
DATED        : April 6, 1999
INVENTOR(S)  : Hisato Shinohara, et. al.

It is certified that error appears in the above-identified patent and that said Letters Patent is hereby corrected as shown below:

Title page, item [73], Assignee: should read -- Semiconductor Energy Laboratory Co., Ltd., Kanagawa-ken, Japan and TDK Corporation, Tokyo, Japan--

Signed and Sealed this

Seventh Day of March, 2000

*Attest:*

*Attesting Officer*

Q. TODD DICKINSON

*Commissioner of Patents and Trademarks*